(12) United States Patent
Okura et al.

(10) Patent No.: US 11,931,821 B2
(45) Date of Patent: Mar. 19, 2024

(54) MAGNESIUM CLAD MATERIAL, ELECTRONIC DEVICE HOUSING, AND MOBILE OBJECT COMPONENT

(71) Applicant: PROTERIAL, LTD., Tokyo (JP)

(72) Inventors: Satoshi Okura, Osaka (JP); Ryoji Inoue, Osaka (JP)

(73) Assignee: PROTERIAL, LTD., Tokyo (JP)

( * ) Notice: Subject to any disclaimer, the term of this patent is extended or adjusted under 35 U.S.C. 154(b) by 228 days.

(21) Appl. No.: 17/438,547

(22) PCT Filed: Mar. 6, 2020

(86) PCT No.: PCT/JP2020/009874
§ 371 (c)(1),
(2) Date: Sep. 13, 2021

(87) PCT Pub. No.: WO2020/184489
PCT Pub. Date: Sep. 17, 2020

(65) Prior Publication Data
US 2022/0143742 A1 May 12, 2022

(30) Foreign Application Priority Data
Mar. 14, 2019 (JP) .................. 2019-046916

(51) Int. Cl.
*B23K 20/00* (2006.01)
*B23K 20/04* (2006.01)
(Continued)

(52) U.S. Cl.
CPC .......... *B23K 20/2333* (2013.01); *B23K 20/04* (2013.01); *B23K 20/16* (2013.01);
(Continued)

(58) Field of Classification Search
None
See application file for complete search history.

(56) References Cited

U.S. PATENT DOCUMENTS 6,635,382 B2 * 10/2003 Moriwaki ........... H01M 50/545
429/176
10,532,422 B2 1/2020 Yamamoto et al.
(Continued)

FOREIGN PATENT DOCUMENTS

CN 107206747 A 9/2017
CN 107406926 A 11/2017
(Continued)

OTHER PUBLICATIONS

Notice for Reasons for Refusal dated May 24, 2022 in corresponding JP appl. 2021-505053 (pp. 1-5) and english translation thereof (pp. 1-5).
(Continued)

*Primary Examiner* — Daniel J. Schleis
(74) *Attorney, Agent, or Firm* — Millen, White, Zelano & Branigan, P.C.; Brion P. Heaney

(57) ABSTRACT

A magnesium clad material 100 includes, when a cross-section thereof cut in a thickness direction thereof is observed, a Mg layer (11), a first Al layer (12) made of pure Al or an Al alloy, and a first joint (13) made of pure Cu or a Cu alloy and arranged between the Mg layer and the first Al layer, and the magnesium clad material has a 0.2% proof stress of 150 MPa or more as measured in a tensile test under a room temperature atmosphere.

12 Claims, 6 Drawing Sheets

(51) Int. Cl.
  *B23K 20/16*     (2006.01)
  *B23K 20/233*    (2006.01)
  *B23K 101/36*    (2006.01)
  *B23K 103/08*    (2006.01)
  *B23K 103/10*    (2006.01)
  *B23K 103/12*    (2006.01)
  *B23K 103/18*    (2006.01)

(52) U.S. Cl.
  CPC ...... *B23K 2101/36* (2018.08); *B23K 2103/10* (2018.08); *B23K 2103/12* (2018.08); *B23K 2103/15* (2018.08); *B23K 2103/18* (2018.08)

(56) References Cited

U.S. PATENT DOCUMENTS

| | | | |
|---|---|---|---|
| 10,851,442 B2 | 12/2020 | Miura et al. | |
| 2018/0010218 A1 | 1/2018 | Miura et al. | |
| 2018/0326530 A1* | 11/2018 | Yamamoto | B32B 15/017 |

FOREIGN PATENT DOCUMENTS

| | | | |
|---|---|---|---|
| EP | 3276019 B1 | 8/2021 | |
| JP | 6-328617 A | 11/1994 | |
| JP | 2007-203351 A | 8/2007 | |
| JP | 2010-155357 A | 7/2010 | |
| JP | 2015-128883 A | 7/2015 | |
| JP | 6135835 B1 | 5/2017 | |
| JP | 2018054159 A | 4/2018 | |
| JP | 2019-166659 A | 10/2019 | |
| WO | 2011/155214 A1 | 12/2011 | |
| WO | WO2017115661 | * | 7/2017 |

OTHER PUBLICATIONS

Extended EP search report dated Apr. 5, 2022 in corresponding EP 20770373.7 (pp. 1-10).
Office Action dated Nov. 14, 2022 in corresponding CN application No. 202080021268.7. (pp. 1-9) and english translation thereof (pp. 1-10).
International Search Report dated Jun. 9, 2020 issued in corresponding PCT/JP2020/009874 application (4 pages).
Office Action dated Jun. 22, 2023 in corresponding CN application No. 202080021268.7. (pp. 1-7) and english translation thereof (pp. 1-11).
Office Action dated Nov. 14, 2023 in corresponding CN application No. 202080021268.7 (pp. 1-9) and English translation thereof (pp. 1-13).

* cited by examiner

MAGNESIUM CLAD MATERIAL, ELECTRONIC DEVICE HOUSING, AND MOBILE OBJECT COMPONENT

TECHNICAL FIELD

The present invention relates to a magnesium clad material, an electronic device housing, and a mobile object component. Specifically, the present invention relates to a magnesium clad material suitable for applications in which weight reduction is desired in personal computers, mobile and in-vehicle electronics, and mobile objects such as automobiles, railroad vehicles, aircrafts, and unmanned aerial vehicles, for example, and an electronic device housing and a mobile object component using this magnesium clad material.

BACKGROUND ART

For example, for the purpose of reducing the weights of personal computers, mobile and in-vehicle electronic devices, transport mobile objects such as automobiles, railroad vehicles, and aircrafts, or mobile objects such as unmanned aerial vehicles, various components (Mg components) made of a magnesium alloy (Mg alloy) having a specific gravity lower than that of aluminum (Al) or an aluminum alloy (Al alloy) are used. However, Mg alloys are inferior in corrosion resistance to Al alloys. Therefore, a magnesium clad material (Mg clad material) in which Al or an Al alloy is provided on a surface of a Mg alloy has been developed. A magnesium layer (Mg layer) serving as a base layer (core material) of the Mg clad material, is made of a Mg alloy, and thus it contributes to weight reduction. An aluminum layer (Al layer) serving as a protective layer (coating material) of the Mg clad material is made of Al or an Al alloy, and thus it contributes to improvement of corrosion resistance, decorativeness, and design.

In the Mg clad material in which the Mg layer and the Al layer are directly bonded to each other, an intermetallic compound is formed between the Mg layer and the Al layer (bonding interface). When this intermetallic compound is excessively formed, it is easy to peel the Mg layer from the Al layer, and thus the bonding strength of the Mg clad material is likely to decrease. Therefore, a Mg clad material having an increased bonding strength between a Mg layer and an Al layer has been developed. For example, in a Mg clad material disclosed in Japanese Patent No. 6135835, a Cu layer made of pure copper (pure Cu) or a copper alloy (Cu alloy) is arranged between a Mg layer made of a Mg alloy (Mg—Li alloy) containing lithium (Li) and an Al layer made of Al or an Al alloy. In this Mg clad material, it is designed that the Cu layer serving as a joint (bonding layer) improves the bonding strength between the Mg layer and the Al layer while a base layer made of the Mg—Li alloy suppresses the specific gravity of the entire Mg clad material to 2.10 or less. The specific gravity of the Mg—Li alloy containing about 9 mass % of Li is about 1.44.

PRIOR ART DOCUMENT

Patent Document

Patent Document 1: Japanese Patent No. 6135835

SUMMARY OF THE INVENTION

Problems to be Solved by the Invention

An object of the present invention is to provide a magnesium clad material using a Mg—Li alloy for a base layer, having improved overall mechanical strength while ensuring its overall lightness, and preferably having flame retardancy to prevent easy ignition, and an electronic device housing and a mobile object component using this magnesium clad material.

Means for Solving the Problems

The means for solving the problems described above, that is, a magnesium clad material (Mg clad material) according to the present invention is as follows.

(1) A magnesium clad material according to the present invention includes, when a cross-section thereof cut in a thickness direction thereof is observed, a Mg layer made of a Mg—Li alloy and serving as a base layer, a first Al layer made of pure Al or an Al alloy, and a first joint made of pure Cu or a Cu alloy and arranged between the Mg layer and the first Al layer, and the magnesium clad material has a 0.2% proof stress of 150 MPa or more as measured in a tensile test under a room temperature atmosphere.

(2) In the magnesium clad material according to the present invention, in the aforementioned (1), the 0.2% proof stress is preferably 180 MPa or more.

(3) In the magnesium clad material according to the present invention, in the aforementioned (1) or (2), the Mg—Li alloy may contain 5 mass % or more and 15 mass % or less of Li, Al, and Zn.

(4) In the magnesium clad material according to the present invention, in the aforementioned (3), the Mg—Li alloy preferably contains 5 mass % or more and 15 mass % or less of Li, 2 mass % or more and 10 mass % or less of Al, and 0.5 mass % or more and 3 mass % or less of Zn.

(5) In the magnesium clad material according to the present invention, in the aforementioned (3) or (4), the 0.2% proof stress is preferably 230 MPa or more and 270 MPa or less.

(6) In the magnesium clad material according to the present invention, in the aforementioned (1) to (5), the Mg—Li alloy may contain Li, Ca, and Zn.

(7) In the aforementioned (1) to (6), the magnesium clad material according to the present invention preferably includes, when the cross-section thereof cut in the thickness direction thereof is observed, a second Al layer made of Al or an Al alloy and arranged on a side of the Mg layer opposite to the first Al layer, and a second joint made of Cu or a Cu alloy and arranged between the Mg layer and the second Al layer.

(8) In the magnesium clad material according to the present invention, in the aforementioned (1) to (7), the Al alloy preferably has a composition corresponding to any one of 5000 series to 7000 series of alloy numbers described in JIS-H4000: 2014.

(9) In the magnesium clad material according to the present invention, in the aforementioned (8), the Al alloy preferably has a composition corresponding to any one of the 5000 series to 6000 series of alloy numbers described in JIS-H4000: 2014.

(10) In the magnesium clad material according to the present invention, in the aforementioned (9), the Al alloy preferably has a composition corresponding to the 5000 series of alloy numbers described in JIS-H4000: 2014, and the 0.2% proof stress is preferably 190 MPa or more and 270 MPa or less.

(11) An electronic device housing according to the present invention is made of a magnesium clad material, the magnesium clad material including, when a cross-section thereof cut in a thickness direction thereof is observed, a Mg layer made of a Mg—Li alloy and serving as a base layer, a first Al layer made of pure Al or an Al alloy, and a first joint made of pure Cu or a Cu alloy and arranged between the Mg layer and the first Al layer, and the magnesium clad material has a 0.2% proof stress of 150 MPa or more as measured in a tensile test under a room temperature atmosphere.

(12) A mobile object component according to the present invention is made of a magnesium clad material, the magnesium clad material including, when a cross-section thereof cut in a thickness direction thereof is observed, a Mg layer made of a Mg—Li alloy and serving as a base layer, a first Al layer made of pure Al or an Al alloy, and a first joint made of pure Cu or a Cu alloy and arranged between the Mg layer and the first Al layer, and the magnesium clad material has a 0.2% proof stress of 150 MPa or more as measured in a tensile test under a room temperature atmosphere.

Effect of the Invention

The Mg clad material having the structure of the present invention uses the Mg—Li alloy for the base layer, and has an improved 0.2% proof stress measured in the tensile test under a room temperature atmosphere and improved overall mechanical strength while ensuring its overall lightness. Thus, the electronic device housing or the mobile object component, which is an example of the Mg component using the Mg clad material having the structure of the present invention, has an improved 0.2% proof stress measured in the tensile test under a room temperature atmosphere and improved overall mechanical strength while ensuring its overall lightness. Furthermore, the Mg clad material using the Mg—Li alloy containing Al for the base layer while having the structure of the present invention has flame retardancy to prevent easy ignition while ensuring its overall lightness. Thus, the electronic device housing or the mobile object component, which is an example of the Mg component using the Mg clad material having the structure of the present invention, has flame retardancy to prevent easy ignition while ensuring its overall lightness.

MODES FOR CARRYING OUT THE INVENTION

An embodiment embodying the present invention relating to a Mg clad material is hereinafter described on the basis of the drawings. An embodiment embodying the present invention relating to a Mg component using this Mg clad material is described on the basis of the drawings, taking an electronic device housing as a typical example.

Figure 1:
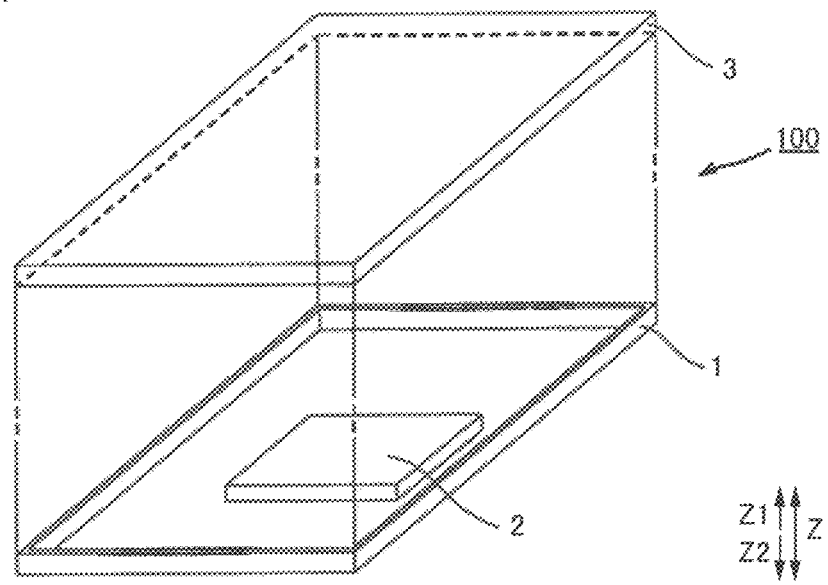
FIG. 1 A diagram schematically showing an electronic device including an electronic device housing according to the present invention.

An electronic device 100 shown in FIG. 1 is a portable electronic device, for example. The electronic device 100 includes a box-shaped housing 1, a substrate 2 arranged on the housing 1, and a display 3 on which an image or the like is displayed. The display 3 is connected to the substrate 2. The box-shaped housing 1 is a structural member of the electronic device 100 and is one Mg component described above. The housing 1 is made of a clad material 5 shown in FIG. 2 or a clad material 10 shown in FIG. 3, which is lightweight and has improved mechanical strength. The housing 1 is formed in a box shape by a shape process such as cutting, punching, or bending. The clad material 5 or the clad material 10, which is a material for the housing 1, has an excellent 0.2% proof stress. The clad material 5 and the clad material 10 are examples of a "magnesium clad material" in the claims, and the box-shaped housing 1 is an example of an "electronic device housing" in the claims.

Figure 2:
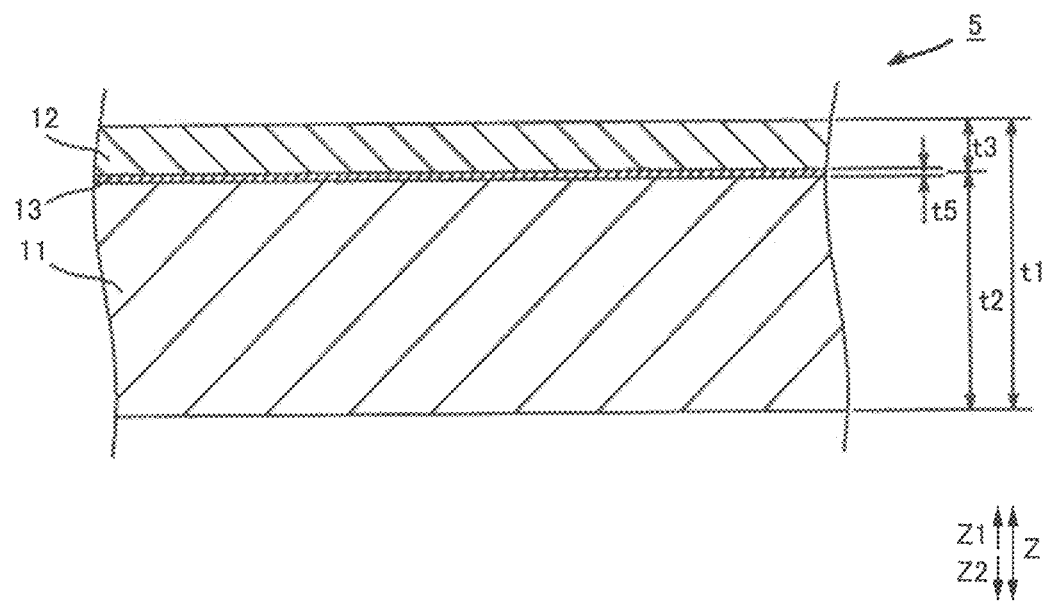
FIG. 2 A diagram showing an example of the cross-section of a Mg clad material having a three-layer structure according to the present invention.

The clad material 5 shown in FIG. 2 is a magnesium clad material having a three-layer structure including a Mg layer 11, an Al layer 12, and a joint 13. In the clad material 5, the Al layer 12, the joint 13, and the Mg layer 11 are stacked and bonded in this order from the Z1 side to the Z2 side in the thickness direction (Z direction). The clad material 5 has a 0.2% proof stress of 150 MPa or more (preferably, 180 MPa or more and more preferably, 200 MPa or more) measured in a tensile test under a room temperature atmosphere. Thus, it is preferable to use the clad material 5 having a high 0.2% proof stress, and the housing 1 made of the clad material 5 is less likely to be deformed. The Mg layer 11, the Al layer 12, and the joint 13 shown in FIG. 2 are examples of a "Mg layer", a "first Al layer", and a "first joint" in the claims.

Figure 3:
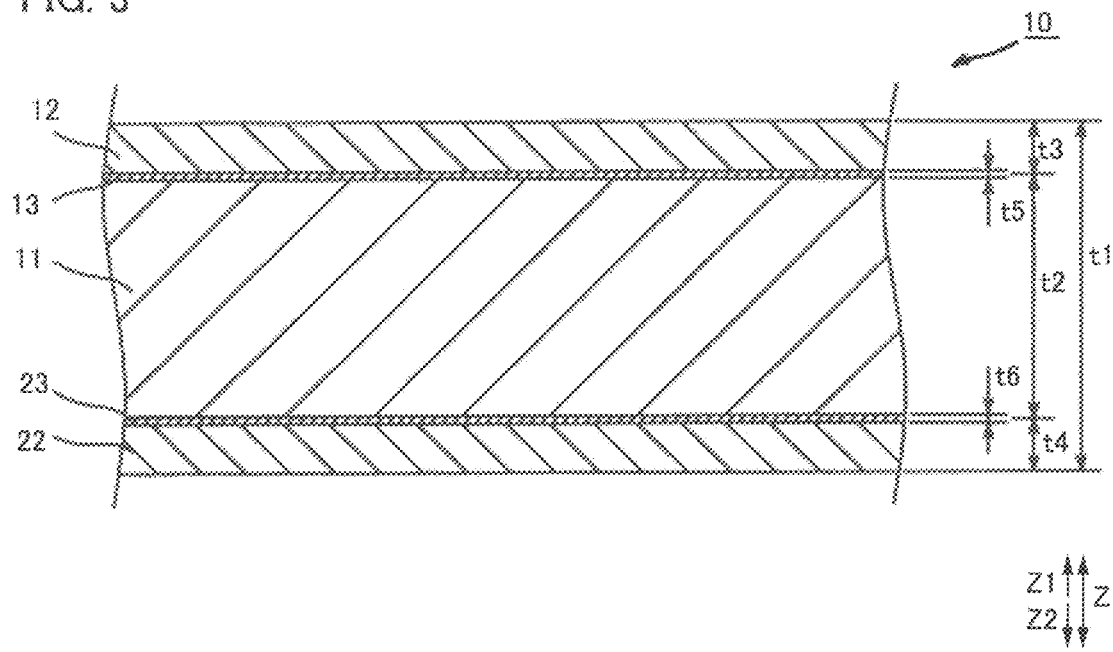
FIG. 3 A diagram showing an example of the cross-section of a Mg clad material having a five-layer structure according to the present invention.
Figure 4:
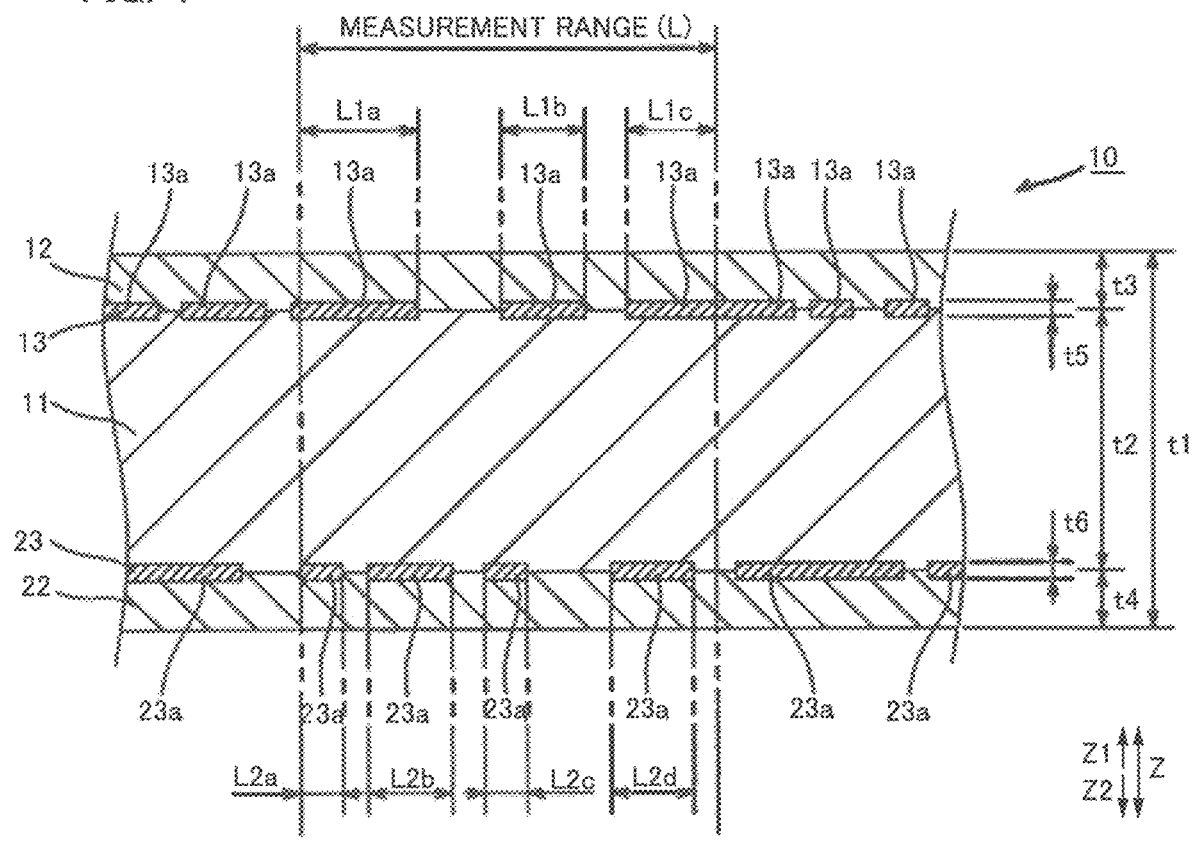
FIG. 4 A diagram showing an example of the cross-section of a Mg clad material having a five-layer structure according to the present invention.

Clad materials 10 shown in FIGS. 3 and 4 are five-layered Mg clad materials each including a Mg layer 11, an Al layer 12, an Al layer 22, and a joint 13, and a joint 23. The same reference numerals are used in FIGS. 2, 3, and 4 for the sake of brevity. In each of the clad materials 10, the Al layer 12, the joint 13, the Mg layer 11, the joint 23, and the Al layer 22 are stacked and bonded in this order from the Z1 side to the Z2 side in the thickness direction (Z direction). The clad material 10 has a 0.2% proof stress of 150 MPa or more (preferably, 180 MPa or more and more preferably, 200 MPa or more) measured in the tensile test under a room temperature atmosphere. Thus, it is preferable to use the clad material 10 having a high 0.2% proof stress, and the housing 1 made of the clad material 10 is less likely to be deformed. As an example of the embodiment of the present invention, the clad materials 10 shown in FIGS. 3 and 4 each have a symmetrical layer structure centered on the Mg layer 11, and thus warpage that tends to occur in the clad material 10 is effectively suppressed. The Mg clad material according to the embodiment of the present invention is not limited to a material having a symmetrical layer structure, but it preferably has a symmetrical layer structure when used for a Mg component that requires flatness, such as the housing 1 shown in FIG. 1. The Mg layers 11, the Al layers 12, the Al layers 22, the joints 13, and the joints 23 shown in FIGS. 3 and 4 are examples of a "Mg layer", a "first Al layer", a "second Al layer", a "first joint", and a "second joint" in the claims.

The clad material 5 and the clad materials 10 can be produced by performing rolling and diffusion annealing on plate materials stacked in the thickness direction, for example. In the clad material 5 and the clad materials 10 produced in this manner, layers in contact with each other are firmly bonded to each other by atomic diffusion or compound formation, for example. Specifically, in the clad material 5 and the clad materials 10, between the Mg layer 11 and the Al layer 12, not only the Al layer 12 and the joint 13 are firmly bonded to each other, but also the Mg layer 11 and the joint 13 are firmly bonded to each other such that the Mg layer 11 and the Al layer 12 are firmly bonded to each other via the joint 13. Furthermore, in the clad materials 10, between the Mg layer 11 and the Al layer 22, not only the Al layer 22 and the joint 23 are firmly bonded to each other, but also the Mg layer 11 and the joint 23 are firmly bonded to each other such that the Mg layer 11 and the Al layer 22 are firmly bonded to each other via the joint 23.

The Mg layers 11 of the clad material 5 and the clad materials 10 are made of a Mg alloy containing Li having a low specific gravity as an additive element, i.e., a Mg—Li alloy. The Mg layers (Mg layers 11) are made of a Mg—Li alloy such that the specific gravities of the Mg layers (Mg layers 11) can be reduced as compared with a case in which Mg layers are made of another Mg alloy that does not contain Li. In the clad material 5 and the clad materials 10, the Mg layers 11 are provided as base layers. The Mg layers 11 made of the Mg—Li alloy are provided as the base layers such that the overall substantial characteristics (such as lightness and mechanical characteristics) of the clad material 5 and the clad materials 10 can be entrusted to the Mg—Li alloy. Thus, the clad material 5 and the clad materials 10 have sufficient characteristics expected as a Mg clad material, are suitable for weight reduction of a Mg component for an electronic device or a mobile object using this Mg clad material, and are particularly suitable for weight reduction of an electronic device housing such as the housing 1 shown in FIG. 1. In order to ensure the effectiveness of the Mg layers 11 as base layers, the thickness ratios of the thicknesses t2 of the Mg layers 11 to the total thicknesses t1 in the clad material 5 and the clad materials 10 represented by (t2/t1)× 100(%) are preferably set to 60% or more and 90% or less, and more preferably set to 65% or more and 90% or less.

The Mg—Li alloy of the Mg layers 11 has a specific gravity lower than those of other Mg alloys that do not contain Li. The Mg layers 11 made of the Mg—Li alloy generally have a specific gravity lower than those of the Al layers (the Al layers 12 shown in FIGS. 2, 3, and 4 and the Al layers 22 shown in FIGS. 3 and 4) made of Al or an Al alloy and those of the joints (the joints 13 shown in FIGS. 2, 3, and 4 and the joints 23 shown in FIGS. 3 and 4) made of Cu or a Cu alloy. Therefore, the specific gravities of the Mg layers 11 are lower than those of the Al layers (Al layers 12 and 22) and lower than those of the joints (joints 13 and 23). Thus, the Mg layers 11 made of the Mg—Li alloy are used as base layers such that the specific gravities of the entire clad materials 10 can be suppressed to be low.

The Mg—Li alloy of the Mg layers 11 contains Li as an additive element, which can reduce the specific gravities of the Mg layers 11, and contains the balance Mg and inevitable impurities. The Mg—Li alloy of the Mg layers 11 may contain one or more of Al, zinc (Zn), calcium (Ca), zirconium (Zr), manganese (Mn), etc., in addition to Li as additive elements, and may contain the balance Mg and inevitable impurities. The specific gravity (independent density g/cm$^3$) of a simple metal is 1.74 for Mg, 0.534 for Li, 2.69 for Al, 7.12 for Zn, 1.55 for Ca, 6.53 for Zr, 7.42 for Mn, 8.93 for Cu, and 8.85 for Ni, for example.

Examples of the Mg—Li alloy of the Mg layers 11 include a Mg—Li—Zn alloy (LZ) containing Li and Zn, a Mg—Li—Ca—Zn alloy (LXZ) containing Li, Ca, and Zn, a Mg—Li—Al alloy (LA) containing Li and Al, a Mg—Li—Al—Zn alloy (LAZ) containing Li, Al, and Zn, a Mg—Li—Al—Zn—Ca alloy (LAZ-X) containing Ca in addition to Li, Al, and Zn, etc., in addition to a Mg—Li alloy containing only Li as an additive element. It is preferable to add the above elements such as Al, Zn, and Ca to the Mg—Li alloy because the mechanical strength of the Mg—Li alloy is improved. For example, a Mg—Li—Al alloy (LA), a Mg—Li—Ca alloy (LX), a Mg—Li—Zn alloy (LZ), a Mg—Li—Al—Ca alloy (LA-X), a Mg—Li—Al—Zn alloy (LAZ), a Mg—Li—Ca—Zn alloy (LXZ), a Mg—Li—Al—Zn—Ca alloy (LAZ-X), etc. are preferably because they are Mg—Li alloys with excellent mechanical strength. Furthermore, a Mg—Li—Al—Zn alloy (LAZ) or a Mg—Li—Al—Zn—Ca alloy (LAZ-X), for example, containing Al is preferable because it has excellent flame retardancy. It has been confirmed in experiments (Examples) described below that these have excellent mechanical strength and flame retardancy.

For example, as the Mg—Li alloy, an alloy (the specific gravity is 1.30 or more and 1.56 or less, for example) containing 5 mass % or more and 15 mass % or less of Li is preferable, and an alloy (the specific gravity is 1.42 or more and 1.47 or less, for example) containing 8 mass % or more and 10 mass % or less of Li is more preferable.

As the Mg—Li—Zn alloy (LZ alloy), for example, an alloy (the specific gravity is 1.30 or more and 1.59 or less, for example) further containing 0.5 mass % or more and 3 mass % or less of Zn with respect to the above Mg—Li alloy is preferable, and examples of such an alloy include a Mg-9.0Li-1.0Zn alloy (LZ91; the specific gravity is 1.48).

As the Mg—Li—Ca—Zn alloy (LXZ alloy), for example, an alloy (the specific gravity is 1.30 or more and 1.54 or less, for example) further containing 0.1 mass % or more and 2 mass % or less of Ca with respect to the above Mg—Li—Zn alloy is preferable, and examples of such an alloy include a Mg-9.0Li-2.0Ca-1.0Zn alloy (LXZ921; the specific gravity is 1.45).

As the Mg—Li—Al alloy (LA alloy), for example, an alloy (the specific gravity is 1.30 or more and 1.55 or less, for example) further containing 0.5 mass % or more and 4 mass % or less of Al with respect to the above Mg—Li alloy is preferable, and examples of such an alloy include a Mg-14Li-1.0Al alloy (LA141; the specific gravity is 1.32).

For example, as the Mg—Li—Al—Zn alloy (LAZ alloy), an alloy (the specific gravity is 1.31 or more and 1.65 or less, for example) further containing 2 mass % or more and 10 mass % or less of Al with respect to the above Mg—Li—Zn alloy, i.e., a Mg—Li—Al—Zn alloy (LAZ) containing 5 mass % or more and 15 mass % or less of Li, 2 mass % or more and 10 mass % or less of Al, and 0.5 mass % or more and 3 mass % or less of Zn, is preferably. The LAZ alloy is a type of Mg—Li alloy having good mechanical strength. The LAZ alloy has an excellent 0.2% proof stress measured under a normal temperature atmosphere. The LAZ alloy is a type of Mg—Li alloy that does not ignite even in a flammability test at 1050° C. and is considered to exhibit flammability by forming a Li—Al compound. Therefore, it is extremely effective in not only preventing ignition in the manufacturing process of the clad material 5 and the clad materials 10 and preventing ignition in the manufacturing process of a Mg component such as an electronic device housing (housing 1) using the clad material 5 or the clad materials 10, but also preventing ignition and spread of fire in a product using the Mg component. One of such LAZ alloys is an alloy (LAZ941) containing 9 mass % of Li, 4 mass % of Al, and 1 mass % of Zn and further containing the balance Mg and inevitable impurities, an alloy (LAZ931) containing 9 mass % of Li, 3 mass % of Al, and 1 mass % of Zn and further containing the balance Mg and inevitable impurities, or an alloy (LAZ921) containing 9 mass % of Li, 2 mass % of Al, and 1 mass % of Zn and further containing the balance Mg and inevitable impurities, for example. These are a type of Mg—Li alloy, and the specific gravities of LAZ921 and LAZ941 are about 1.46 and about 1.47, respectively. As described in detail below, for example, the clad materials 10 each including the Mg layer 11 made of LAZ941 and the Al layers (Al layers 12 and 22) made of an Al—Mg alloy such as A5052 have a 0.2% proof stress of 200 MPa or more measured in the tensile test under a room temperature atmosphere, and a 0.2% proof stress of 300 MPa or more measured in a three-point bending test under a room temperature atmosphere.

Examples of the Mg—Li—Al—Zn—Ca alloy (LAZ-X alloy) include an alloy (the specific gravity is 1.31 or more and 1.64 or less, for example) further containing 0.1 mass % or more and 2 mass % or less of Ca with respect to the above Mg—Li—Al—Zn alloy. The Mg—Li—Al—Zn—Ca alloy is a type of Mg—Li alloy considered to have flame retardancy by forming a Li—Al compound similarly to the Mg—Li—Al—Zn alloy. The unit of numerical values representing the compositions of the above Mg—Li alloys is "mass %". All the above Mg—Li alloys contain inevitable impurities. The specific gravities appended to the above Mg—Li alloys are alloy densities (g/cm$^3$).

All the above Mg—Li alloys have good ductility (rolling workability), and thus the clad material 5 and the clad materials 10 can be easily produced by rolling. When the lightness of the housing 1 is important, the clad material 5 or the clad materials 10 used for the housing 1 preferably have a lower specific gravity. Therefore, in order to further reduce the weights of the Mg layers 11, which are the base layers of the clad material 5 and the clad materials 10, a Mg alloy having a sufficiently low specific gravity, e.g., a Mg—Li alloy containing 6 mass % or more and 15 mass % or less of Li, is preferably used. When the Li content in the Mg—Li alloy is 6 mass % or more (preferably 8 mass % or more), the ductility of the Mg layers 11 can be improved, and thus the press workability of the clad material 5 and the clad materials 10 such as bending can be improved. When the Li content in the Mg—Li alloy is 15 mass % or less (preferably 10 mass % or less), an effect of suppressing a decrease in the corrosion resistance of the Mg layers 11 can be expected.

The Al layer (Al layer 12 shown in FIG. 2) of the clad material 5 is made of Al or an Al alloy. The Al layer 12 is arranged so as to prevent a surface of the Mg layer 11 on the Z1 side from being exposed. With this structure, the Al layer 12 functions as a coating layer having better corrosion resistance than the Mg layer 11, and the corrosion of the surface of the Mg layer 11 on the Z1 side is suppressed. Furthermore, the Al layer 12 is made of Al or an Al alloy such that surface treatment such as alumite treatment on one side of the clad material 5 becomes easy.

The first Al layers (Al layers 12 shown in FIGS. 3 and 4) and the second Al layers (Al layers 22 shown in FIGS. 3 and 4) of the clad materials 10 are made of Al or an Al alloy. The Al layers 12 are arranged so as to prevent surfaces of the Mg layers 11 on the Z1 side from being exposed, and the Al layers 22 are arranged so as to prevent surfaces of the Mg layers 11 on the Z2 side from being exposed. With this structure, the Al layers 12 and the Al layers 22 function as a coating layer having better corrosion resistance than the Mg layers 11, and the corrosion of the Z1 side surfaces and the Z2 side surfaces of the Mg layers 11 is suppressed. Both the Al layers 12 and the Al layers 22 are made of Al or an Al alloy such that surface treatment such as alumite treatment on both surfaces of the clad materials 10 becomes easy. The Al layers 12 and the Al layers 22 are preferably made of Al or an Al alloy having substantially the same composition. Furthermore, the thicknesses t3 of the Al layers 12 and the thicknesses t4 of the Al layers 22 are preferably substantially the same. Thus, it is not necessary to strictly distinguish the front and back surfaces of the clad materials 10.

In the electronic device 100, when the lightness of the housing 1 is particularly important, the clad material 5 or the clad materials 10 used for the housing 1 preferably have a lower specific gravity. Therefore, in order to further reduce the weight of the clad material 5 or the clad materials 10, it is preferable to sufficiently reduce the thickness(es) of the Al layer(s) with respect to the total thickness t1 of the clad material 5 or the clad materials 10. Specifically, in the clad material 5, the thickness t3 of the Al layer 12 is preferably sufficiently small, and in the clad materials 10, the thicknesses t3 of the Al layers 12 and the thicknesses t4 of the Al layers 22 are preferably sufficiently small.

In this case, it is preferable to ensure the effectiveness of the Al layers (Al layers 12 and 22) as a coating layer. Specifically, in the clad material 5 having a three-layer structure, (t3/t1)×100(%) representing the thickness ratio of the thickness t3 of the Al layer 12 to the total thickness t1 of the clad material 5, taking into consideration the thickness ratio of the thickness t2 of the Mg layer 11 described above, is preferably set to 10% or more and 40% or less, and more preferably set to 10% or more and 35% or less. Note that (t5/t1)×100(%) representing the thickness ratio of the thickness t5 of the joint 13 to the total thickness t1 of the clad material 5 is 0.5% or less, for example, which is sufficiently small. Therefore, the thickness t5 of the joint 13 may be ignored. For example, when the specific gravity of the entire clad material 5 is calculated, the total thickness of the thickness t2 of the Mg layer 11 and the thickness t3 of the Al layer 12 may be used as the total thickness t1 of the clad material 5.

In the clad materials 10 having a five-layer structure, (t3/t1)×100(%) representing the thickness ratios of the thicknesses t3 of the Al layers 12 to the total thicknesses t1 of the clad materials 10 is preferably set to 5% or more and 20% or less, and more preferably set to 5% or more and 17.5% or less. Similarly, (t4/t1)×100(%) representing the thickness ratios of the thicknesses t4 of the Al layers 22 to the total thicknesses t1 of the clad materials 10 is preferably set to 5% or more and 20% or less, and more preferably set to 5% or more and 17.5% or less. Note that (t5/t1)×100(%) representing the thickness ratios of the thicknesses t5 of the joints 13 to the total thicknesses t1 of the clad materials 10 and (t6/t1)×100(%) representing the thickness ratios of the thicknesses t6 of the joints 23 to the total thicknesses t1 of the clad materials 10 are 0.5% or less, for example, which is sufficiently small. Therefore, both the thicknesses t5 of the joints 13 and the thicknesses t6 of the joints 23 may be ignored. For example, when the specific gravities of the entire clad materials 10 are calculated, the total thicknesses of the thicknesses t2 of the Mg layers 11, the thicknesses t3 of the Al layers 12, and the thicknesses t4 of the Al layers 22 may be used as the total thicknesses t1 of the clad materials 10.

As the Al or Al alloys of the Al layers (Al layers 12 and 22), any Al or Al alloy may be used as long as the 0.2% proof stresses of the clad material 5 and the clad materials 10 measured in the tensile test under a room temperature atmosphere are 150 MPa or more (preferably 180 MPa or more and more preferably 200 MPa or more) in consideration of the clad structure (the number of Al layers, the thicknesses of the Al layers, the materials for the Mg layers, the thicknesses of the Mg layers, etc.). When alumite treatment is performed on the Al layers (Al layers 12 and 22), the thicknesses t3 of the Al layers 12 and the thicknesses t4 of the Al layers 22 are each preferably at least 50 μm and more preferably 100 μm or more.

Examples of Al applicable to the Al layers include high-purity aluminum (pure Al) such as A1050. Pure Al has a composition corresponding to the 1000 series of alloy numbers described in JIS-H4000: 2014. The composition of pure Al is a composition shown in TABLE 2 of JIS-H4000: 2014, for example. Pure Al has good moldability, weldability, and corrosion resistance. The good ductility (rolling workability) of pure Al facilitates production of the clad material 5 and the clad materials 10 by rolling.

Examples of Al alloys applicable to the Al layers include an Al—Mg alloy such as A5052 containing Mg, an Al—Mg—Si alloy such as A6061 containing Mg and Si, and an Al—Zn—Mg such as A7204 containing Zn and Mg. The Al—Mg alloy has a composition corresponding to the 5000 series of alloy numbers described in JIS-H4000: 2014, for example. For the composition of the Al—Mg alloy, refer to TABLE 2 of JIS-H4000: 2014. The Al—Mg alloy containing 0.5 mass % or more and 3 mass % or less of Mg has good moldability, weldability, and corrosion resistance, and has high mechanical strength. The Al—Si alloy containing 3 mass % or more and 15 mass % or less of Si has mechanical strength while having good ductility (rolling workability) close to that of pure Al. The Al—Mg—Si alloy has a composition corresponding to the 6000 series of alloy numbers described in JIS-H4000: 2014, for example. For the composition of the Al—Mg—Si alloy, refer to TABLE 2 of JIS-H4000: 2014. The Al—Mg—Si alloy containing 0.3 mass % or more and 1.5 mass % or less of Mg and 0.3 mass % or more and 1.5 mass % or less of Si has excellent mechanical strength and good corrosion resistance. The Al—Zn—Mg alloy has a composition corresponding to the 7000 series of alloy numbers described in JIS-H4000: 2014, for example. For the composition of the Al—Zn—Mg alloy, refer to TABLE 2 of JIS-H4000: 2014. The Al—Zn—Mg alloy containing 3.5 mass % or more and 7.5 mass % or less of Zn and 0.5 mass % or more and 5.5 mass % or less of Mg has excellent mechanical strength and weldability and good corrosion resistance. The Al—Zn—Mg alloy may contain 1 mass % or more and 3 mass % or less of Cu and 0.1 mass % or more and 0.3 mass % or less of Cr (chromium) in addition to Zn and Mg. Among the above Al alloys, an Al alloy having a composition corresponding to any one of the 5000 series to the 7000 series of alloy numbers (preferably the 5000 series to the 6000 series) described in JIS-H4000: 2014 is preferably used for the Al layers (Al layers 12 and 22), and the mechanical strength of the clad material 5 and the clad materials 10, e.g., a 0.2% proof stress measured in the tensile test under a room temperature atmosphere as mechanical strength, can be increased.

In the clad material 5, the joint 13 is arranged between the Mg layer 11 and the Al layer 12. When the cross-section obtained when the clad material 5 is cut in the Z direction is observed, the joint 13 is arranged between the Mg layer 11 and the Al layer 12. The joint 13 bonds the Mg layer 11 to the Al layer 12. Thus, direct bonding between the Mg layer 11 and the Al layer 12 can be prevented by the joint 13, as shown in FIG. 2, or a direct bonding area can be reduced by the joint 13 in the clad material 10, as shown in FIG. 4. The Mg layer 11 made of a Mg—Li alloy having low bonding strength to the Al layer 12 made of Al or an Al alloy is bonded to the Al layer 12 via the joint 13 made of an appropriate material such that the bonding strength between the Mg layer 11 and the Al layer 12 can be ensured.

In the clad materials 10, the joints 13 are arranged between the Mg layers 11 and the Al layers 12, and the joints 23 are arranged between the Mg layers 11 and the Al layers 22. When the cross-sections obtained when the clad materials 10 are cut in the Z direction are observed, the joints 13 are arranged between the Mg layers 11 and the Al layers 12, and the joints 23 are arranged between the Mg layers 11 and the Al layers 22. The joints 13 bond the Mg layers 11 to the Al layers 12, and the joints 23 bond the Mg layers 11 to the Al layers 22. Thus, the joint 13 can prevent direct bonding between the Mg layer 11 and the Al layer 12, as shown in FIG. 3, or can reduce a direct bonding area, as shown in FIG. 4. Furthermore, the joint 23 can prevent direct bonding between the Mg layer 11 and the Al layer 22, as shown in FIG. 3, or can reduce a direct bonding area, as shown in FIG. 4. The Mg layers 11 made of a Mg—Li alloy having low bonding strength to the Al layers 12 and the Al layers 21 made of Al or an Al alloy are bonded to the Al layers 12 and the Al layers 22 via the joints 13 and the joints 23 made of an appropriate material such that the bonding strength between the Mg layers 11 and the Al layers 12 and between the Mg layers 11 and the Al layers 22 can be ensured.

The joint (joint 13 shown in FIG. 2) of the clad material 5 is made of Cu (pure Cu) or a Cu alloy. The first joints (joints 13 shown in FIGS. 3 and 4) and the second joints (joints 23 shown in FIGS. 3 and 4) of the clad materials 10 are made of Cu or a Cu alloy. In the clad material 5 or the clad materials 10, the joints 13 made of Cu or a Cu alloy are easily bonded to the Mg—Li alloys of the Mg layers 11 while the joints 13 are easily bonded to the Al or Al alloys of the Al layers 12. Therefore, in the clad layer structure in which the joint 13 is provided between the Mg layer 11 and the Al layer 12, the bonding strength between the Mg layer 11 and the Al layer 12 can be increased as compared with the clad layer structure in which the Mg layer 11 and the Al layer 12 are directly bonded to each other. This point also applies to the clad layer structure of the clad materials 10 in which the joint 23 is provided between the Mg layer 11 and the Al layer 22.

When the joint 13 made of a Cu alloy (Cu—Zn alloy) containing Zn, for example, is provided between the Mg layer 11 and the Al layer 12 in the end face of the clad material 5, the end faces of the clad materials 10, or the end face of the housing 1 using the clad material 5 or the clad materials 10, on which the clad layer structure is exposed to the outside, the progress of the corrosion of the Mg layer 11 on the end face can be suppressed. The effect of suppressing the progress of the corrosion (electrolytic corrosion between Mg and the Cu alloy) of the Mg layer 11 on the end face increases because in the joint 13, the corrosion potential shifts to the negative side as compared with pure Cu due to Zn added to Cu and approaches that of Mg. This point also applies to the end faces of the clad materials 10 each including the joint 23 between the Mg layer 11 and the Al layer 22 and the end face of the housing 1 using the clad materials 10 on which the clad layer structure is exposed to the outside.

Examples of Cu of the joints (joints 13 and/or 23) in the clad material 5 or the clad materials 10 include pure Cu such as C1020 (oxygen-free copper), C1100 (tough pitch copper), and C1201 (phosphorus deoxidized copper), and C1220 (phosphorus deoxidized copper) described in JIS-H3100: 2012). Furthermore, examples of the Cu alloys of the joints (joints 13 and/or 23) in the clad material 5 or the clad materials 10 include Cu—Zn alloys such as C2600 and C2801, Cu—Ni alloys such as C7060 and C7150, and Cu—Ni—Zn alloys such as C7351, C7451, C7521, and C7541 described in JIS-H3100: 2012.

The plate-shaped clad material 5 shown in FIG. 2 can be produced by rolling (clad rolling) and diffusion annealing a plate material corresponding to the Mg layer 11, a plate material corresponding to the joint 13, and a plate material corresponding to the Al layer 12 while stacking the same in this order in the thickness direction (see FIG. 5), for example. Each of the plate-shaped clad materials 10 shown in FIGS. 3 and 4 can be produced by rolling and diffusion annealing a plate material corresponding to the Al layer 12, a plate material corresponding to the joint 13, a plate material corresponding to the Mg layer 11, a plate material corresponding to the joint 23, and a plate material corresponding to the Al layer 22 while stacking the same in this order in the thickness direction (see FIG. 6), for example. In rolling (clad rolling), at least the plate materials corresponding to the Mg layers 11 are heated to 150° C. or higher, for example. In diffusion annealing, the Mg clad materials after rolling (clad rolling) are heated to 150° C. or higher, for example.

When the cross-sections of the clad materials 10 cut in the thickness direction (Z direction) are observed, the joints between the Mg layers and the Al layers are each in the form of a layer that is continuously connected in the rolling direction, or in the form of islands that are discontinuously arranged in the rolling direction. Specifically, the joint 13 in the clad material 10 is entirely continuously connected in the form of a layer between the Mg layer 11 and the Al layer 12, as shown in FIG. 3, or is arranged in the form of islands between the Mg layer 11 and the Al layer 12, as shown in FIG. 4. This point also applies to the clad layer structure in which the joint 23 is provided between the Mg layer 11 and the Al layer 22. The same applies to the joint 13 between the Mg layer 11 and the Al layer 12 in the clad material 5.

When the cross-section is observed, the joint 13 between the Mg layer 11 and the Al layer 12 in the clad material 5 is preferably arranged in the form of islands (see island-shaped portions 13a shown in FIG. 4). When the cross-section is observed, the joint 13 between the Mg layer 11 and the Al layer 12 and the joint 23 between the Mg layer 11 and the Al layer 21 in the clad material 10 are preferably arranged in the form of islands (see island-shaped portions 23a shown in FIG. 4). Note that "form of islands" indicates that the plate materials (such as Cu—Zn alloy plate materials) for forming the joints (joints 13 and 23) are broken in the manufacturing process for the Mg clad materials (clad materials 5 and 10) such that the joints (joints 13 and 23) are not entirely connected in the form of a continuous layer between the Mg layer 11 and the Al layers (Al layers 12 and 22).

With this structure, as compared with a case in which when the cross-sections are observed, the joints (joints 13 and 23) of the Mg clad materials (clad materials 5 and 10) are entirely connected in the form of a continuous layer between the Mg layers 11 and the Al layers (Al layers 12 and 22), it is possible to reduce the proportions of Cu or Cu alloys in the entire Mg clad materials, which are higher in specific gravity than the Mg—Li alloys and Al or the Al alloys. Furthermore, on the end faces on which the clad layer structures are exposed, the proportions of Cu, the corrosion potential of which is on the positive side relative to that of Mg, can be reduced. Thus, the specific gravities of the entire Mg clad materials become lower, and thus the weights of the Mg clad materials can be further reduced. Furthermore, the proportion of Cu having a noble potential is smaller than that of Mg, and thus the progress of the corrosion of the Mg layers 11 on the end faces can be further suppressed. This point also applies to the clad layer structure in which the joint 23 is provided between the Mg layer 11 and the Al layer 22, and the joint 23 is preferably arranged in the form of islands (island-shaped portions 23a) between the Mg layer 11 and the Al layer 22.

As shown in FIG. 4, when the cross-section is observed, it is preferable to distribute the island-shaped joint 13 (island-shaped portions 13a) of the clad material 10 throughout between the Mg layer 11 and the Al layer 12 as compared with a case in which the joint 13 is partially intensively arranged between the Mg layer 11 and the Al layer 12. When the cross-section is observed, it is preferable to arrange the island-shaped joint 13 (island-shaped portions 13a) in about 10% or more and about 90% or less of a portion between the Mg layer 11 and the Al layer 12 (the abundance ratio is preferably about 10% or more and about 90% or less when the cross-section is observed), and it is more preferable to arrange the island-shaped joint 13 (island-shaped portions 13a) in about 20% or more and about 80% or less of a portion between the Mg layer 11 and the Al layer 12 (the abundance ratio is preferably about 20% or more and about 80% or less when the cross-section is observed). This point also applies to the clad layer structure in which the joint 23 is provided between the Mg layer 11 and the Al layer 22 and has an island shape (island-shaped portions 23a) joint 23 when the cross-section is observed. The same applies to the joint 13 between the Mg layer 11 and the Al layer 12 in the clad material 5.

When the cross-sections are observed, the abundance ratios of the joints (joints 13 and 23) in the Mg clad materials are calculated as follows. The joint 13 of the clad material 10 shown in FIG. 4 is described. FIG. 4 shows a cross-section obtained by cutting the clad material 10 in the thickness direction (Z direction) and acquired using a microscope, for example. Within a measurement range of a certain length L (L=1000 μm, for example) in a direction along a portion between the Mg layer 11 and the Al layer 12 of this cross-section, the total length in which the island-shaped portions 13a of the joint 13 exist is acquired. Then, the abundance ratio of the joint 13 is calculated by dividing the acquired total length by L. For example, in the case shown in FIG. 4, the abundance ratio (%) of the joint 13 is calculated by $((L1a+L1b+L1c)/L) \times 100$. When the cross-section is observed, it is more preferable to arrange the joint 13 in about 20% or more and about 80% or less of a portion between the Mg layer 11 and the Al layer 12. Furthermore, the above measurement is performed at a plurality of different measurement positions of the joint 13 (three or more and ten or less measurement positions, for example), and the average thereof is taken as the abundance ratio (%) of the joint 13. This point can also apply to the clad layer structure in which the joint 23 is provided between the Mg layer 11 and the Al layer 22 and has an island shape (island-shaped portions 23a) when the cross-section is observed. In the case shown in FIG. 4, similarly to the joint 13, the total length in which the island-shaped portions 23a of the joint 23 exist is acquired such that the abundance ratio (%) of the joint 23 is calculated by $((L2a+L2b+L2c+L2d)/L)\times100$, for example. Furthermore, the abundance ratio (%) of the joints in the entire clad material 10 can be represented by an arithmetic mean value of the abundance ratio (%) of the joint 13 and the abundance ratio (%) of the joint 23. The above abundance ratio of the joints in the Mg clad material can also be applied to the joint 13 between the Mg layer 11 and the Al layer 12 in the clad material 5.

When the cross-sections are observed, the thicknesses of the joints (joints 13 and 23) of the Mg clad materials are preferably 0.5 μm or more and 6 μm or less. For example, t5 in FIG. 2 showing the clad material 5 and t5 in FIGS. 3 and 4 showing the clad material 10 are the thicknesses of the joints 13 in a sectional view. Furthermore, t6 in FIGS. 3 and 4 showing the clad material 10 is the thickness of the joint 23 in a sectional view. The "thickness of the joint" refers to the average thickness of a plurality of portions of the joint in the cross-section. That is, as shown in FIG. 4, in a case in which the joint 13 is arranged in the form of islands (island-shaped portions 13a) when the cross-section is observed, the thickness of the joint 13 at positions at which the joint 13 is not arranged is assumed to be zero, and the average thickness is acquired. With this structure, the thickness of the joint 13 in a sectional view is 0.5 μm or more such that the joint 13 can be sufficiently ensured, and thus a decrease in the bonding strength between the Mg layer 11 and the Al layer 12 can be suppressed. Furthermore, the thickness of the joint 13 in a sectional view is 6 μm or less such that the excessive joint 13 made of Cu or a Cu alloy having a higher specific gravity than a Mg—Li alloy, Al (pure Al), and an Al alloy can be suppressed, and thus an increase in the specific gravity of the entire clad material 10 can be suppressed. The above structure regarding the thickness of the joint 13 in the Mg clad material is the same for the clad layer structure in which the joint 23 is provided between the Mg layer 11 and the Al layer 22. The same applies to the joint 13 between the Mg layer 11 and the Al layer 12 in the clad material 5.

In each of the clad material 5 and the clad material 10, the thickness t5 of the joint 13 made of Cu or a Cu alloy having a higher specific gravity than the Mg—Li alloy of the Mg layer 11 and the Al or Al alloy of the Al layer 12 is preferably equal to or less than the thickness t2 of the Mg layer 11 and equal to or less than the thickness t3 of the Al layer 12. Similarly, in the clad material 10, the thickness t6 of the joint 23 made of Cu or a Cu alloy having a higher specific gravity than the Mg—Li alloy of the Mg layer 11 and the Al or Al alloy of the Al layer 22 is preferably equal to or less than the thickness t2 of the Mg layer 11 and equal to or less than the thickness t4 of the Al layer 22. In the clad material 5 and the clad material 10, the thicknesses (t5 and t6) of the joints (joints 13 and 23) are preferably about 6 μm or less in order to reduce the specific gravities of the entire Mg clad materials, and preferably about 0.5 μm or more in order to ensure the bonding strength between the Mg layers 11 and the Al layers (Al layers 12 and 22).

A method for manufacturing the Mg clad materials (clad materials 5 and 10) according to the embodiment of the present invention is now described with reference to FIGS. 1 to 6.

Figure 5:
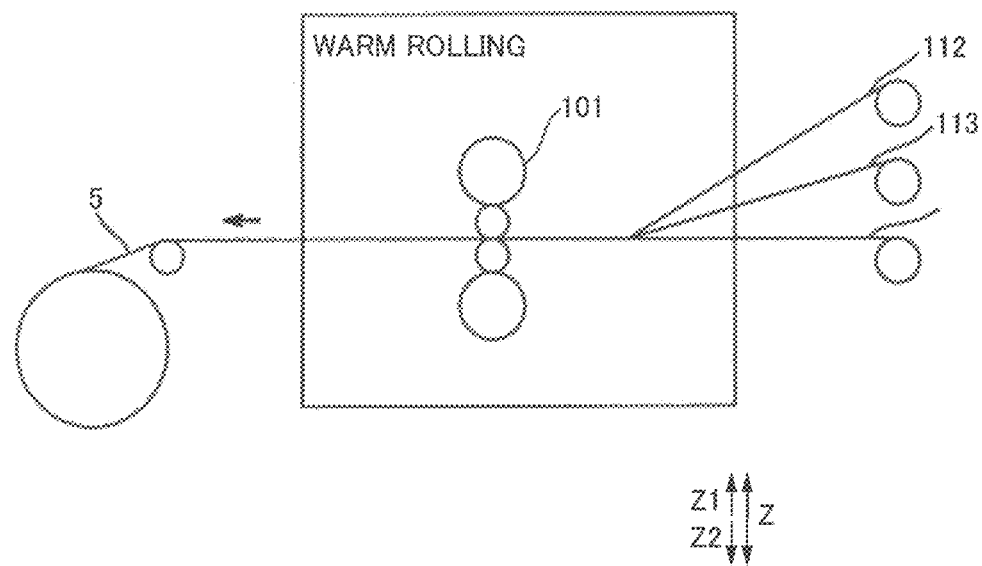
FIG. 5 A diagram illustrating a method for manufacturing the Mg clad material having the three-layer structure according to the present invention.

When the clad material 5 is manufactured, for example, as shown in FIG. 5, a Mg plate material 111 made of a Mg—Li alloy, an Al plate material 112 made of Al or an Al alloy, and a Cu plate material 113 made of Cu or a Cu alloy are prepared. Then, the Mg plate material 111, the Cu plate material 113, and the Al plate material 112 are continuously stacked in this order. At this time, each plate material is stacked such that an overlay Mg clad material is formed. Then, the three stacked metal plates are continuously warm rolled using a roller 101 heated to a predetermined temperature condition. Thus, a clad material corresponding to the clad material 5 as shown in FIG. 2, i.e., a clad material in which the Mg layer 11 and the Al layer 12 are stacked, and the joint 13 is arranged between the Mg layer 11 and the Al layer 12, is produced. Then, the warm rolled clad material is diffusion annealed under conditions such as a predetermined holding temperature, holding time, and atmosphere in a furnace. Thus, the clad material 5 (Mg clad material) applicable to the Mg component (housing 1), which is a structural member of the electronic device 100 (see FIG. 1), is produced.

Figure 6:
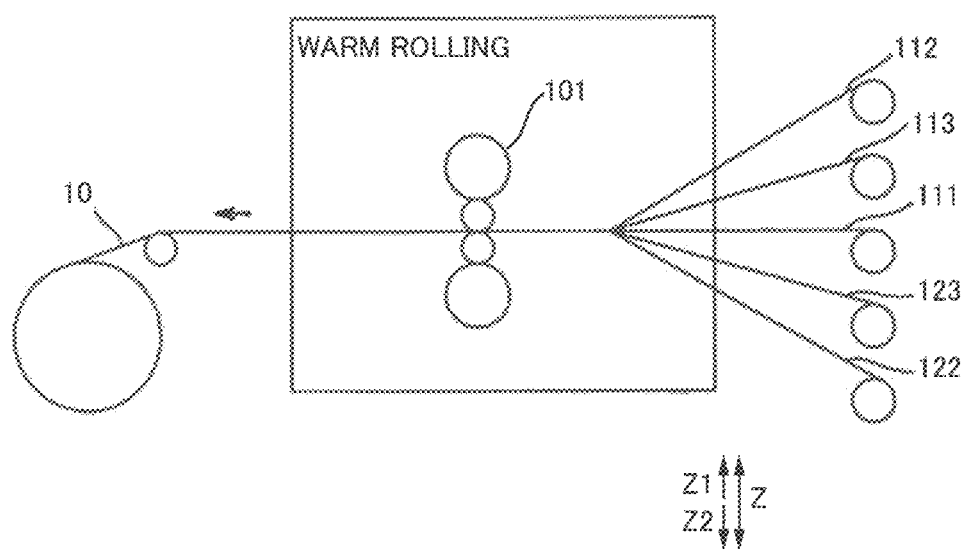
FIG. 6 A diagram illustrating a method for manufacturing the Mg clad material having the five-layer structure according to the present invention.

When the clad material 10 is manufactured, for example, as shown in FIG. 6, a Mg plate material 111 made of a Mg—Li alloy, an Al plate material 112 made of Al or an Al alloy, an Al plate material 122 made of Al or an Al alloy, a Cu plate material 113 made of Cu or a Cu alloy, and a Cu plate material 123 made of Cu or a Cu alloy are prepared. Then, the Mg plate material 111, the Cu plate material 113, the Al plate material 112, the Cu plate material 123, and the Al plate material 122 are continuously stacked in this order. At this time, each plate material is stacked such that an overlay Mg clad material is formed. Then, the five stacked metal plates are continuously warm rolled using a roller 101 heated to a predetermined temperature condition. Thus, a clad material corresponding to the clad material 10 as shown in FIG. 3 or 4, i.e., a clad material in which the Al layer 12, the Mg layer 11, and the Al layer 22 are stacked, the joint 13 is arranged between the Mg layer 11 and the Al layer 12, and the joint 23 is arranged between the Mg layer 11 and the Al layer 22, is produced. Then, the warm rolled clad material is diffusion annealed under conditions such as a predetermined holding temperature, holding time, and atmosphere in a furnace. Thus, the clad material 10 (Mg clad material) applicable to the Mg component (housing 1), which is a structural member of the electronic device 100 (see FIG. 1), is produced.

When each of the clad material 5 and the clad material 10 is manufactured, the Mg plate material 111, the Al plate material(s) (Al plate materials 112 and 122), and the Cu plate material(s) (Cu plate materials 113 and 123) are preferably annealed materials produced by annealing under conditions such as a predetermined holding temperature, holding time, and atmosphere in the furnace suitable for each material. Furthermore, the thicknesses of the Mg plate material 111, the Al plate material(s) (Al plate materials 112 and 122), and the Cu plate material(s) (Cu plate materials 113 and 123) are preferably adjusted in consideration of each material such that the specific gravities of the entire Mg clad materials (clad materials 5 and 10) after bonding are 2.10 or less, preferably 2.00 or less, and more preferably 1.90 or less, for example. The temperature condition for warm rolling is adjusted by giving priority to the material for the Mg plate material 111 made of a Mg—Li alloy, and is preferably adjusted to about 150° C. or higher and 300° C. or lower. The conditions for diffusion annealing are adjusted by giving priority to the material for the Mg plate material 111 (Mg layer 11) made of a Mg—Li alloy, and are preferably adjusted to a holding temperature of about 150° C. or higher and 350° C. or lower and a holding time of about one minute or longer and five minutes or shorter. When a Mg—Li—Al alloy (LA alloy) such as LA141, a Mg—Li—Al—Zn alloy (LAZ alloy) such as LAZ941, a Mg—Li—Al—Ca alloy, or a Mg—Li—Al—Zn—Ca alloy, for example, containing Al is applied as a Mg—Li alloy to the Mg layer 11, the temperature condition for warm rolling is preferably adjusted to about 150° C. or higher and 250° C. or lower, and the condition for diffusion annealing is preferably adjusted to about 150° C. or higher and 250° C. or lower.

When each of the clad material 5 and the clad material 10 is manufactured, the elongation of the joint 13 during warm rolling cannot follow the elongation of the Mg layer 11 and the elongation of the Al layer 12 when the thickness t5 of the joint 13 is a certain value or less, and the joint 13 is easily broken. Thus, when the cross-section is observed, a Mg clad material having the island-shaped joint 13 (see the island-shaped portions 13a shown in FIG. 4) is produced. On the other hand, when the thickness t5 of the joint 13 exceeds the certain value, the elongation of the joint 13 during warm rolling can follow the elongation of the Mg layer 11 and the elongation of the Al layer 12, and the joint 13 is hardly broken. Thus, when the cross-section is observed, a Mg clad material having the layered joint 13 (see the joints 13 shown in FIGS. 2 and 3) is produced. This point is the same for the clad layer structure in which the joint 23 is provided between the Mg layer 11 and the Al layer 22.

EXAMPLES

An evaluation test of mechanical characteristics conducted to confirm the effect of the present invention and the results thereof are described. The Mg clad material used for the evaluation test was a test piece cut out from the clad material 10 having a five-layer structure in which both sides of the Mg layer 11 were protected in consideration of the risk of corrosion during the test. For reference, a test piece was cut out for a Mg plate material made of a Mg—Li alloy (LZ91, LAZ941) and having a thickness of 0.6 mm, an Al plate material made of an Al alloy (A5052) and having a thickness of 0.6 mm, and a Mg plate material made of a Li-free Mg—Al—Zn alloy (AZ31) and having a thickness of 0.6 mm in the same manner, and evaluation was performed in the same manner as the Mg clad material.

In the manufacturing of the clad material 10 used for the evaluation test, a Mg plate material having a thickness of about 3 mm, an Al plate material having a thickness of about 3 mm, and a Cu plate material having a thickness of about 0.03 mm were used as the materials. The clad material 10 used for the evaluation test was manufactured by sequentially performing rolling to form a five-layer structure (clad rolling step), heat treatment held at 200° C. for three minutes (diffusion annealing step), rolling to have a total thickness of 0.6 mm (finish rolling step), and heat treatment held at 350° C. for three minutes or heat treatment held at 350° C. for five minutes (soft annealing step). The clad material 10 used for the evaluation test had a total thickness t1 of 0.6 mm, the thickness t2 of the Mg layer 11 was about 400 μm, the thickness t3 of the Al layer 12 and the thickness t4 of the Al layer 22 were about 100 μm, and the thickness t5 of the first joint 13 and the thickness t6 of the second joint 23 were about 1 μm (less than 1 μm). When it is considered that the thickness t5 of the first joint 13 and the thickness t6 of the second joint 23 are extremely smaller than the thickness t2 of the Mg layer 11, the thickness t3 of the Al layer 12, and the thickness t4 of the Al layer 22, and the thickness t5 of the first joint 13 and the thickness t6 of the second joint 23 are ignored, the thickness ratio (t3:t2:t4) of the Al layer 12, the Mg layer 11, and the Al layer 22 is 1:4:1.

As the Mg—Li alloy of the Mg layer 11 of the clad material 10, a Mg—Li—Zn alloy (LZ91 in TABLE 1) containing about 9 mass % of Li and about 1 mass % of Zn, a Mg—Li—Al—Zn alloy (LAZ941 in TABLE 1) containing about 9 mass % of Li, about 9 mass % of Al, and about 1 mass % of Zn, or a Mg—Li—Ca—Zn alloy (LXZ921 in TABLE 1) containing about 9 mass % of Li, about 1 mass % of Zn, and about 2 mass % of Ca was used. As the Al or Al alloy of the Al layer (Al layer 12, Al layer 22) of the clad material 10, pure Al (A1050 in TABLE 1) containing 99.5 mass % or more of Al or an Al alloy (A5052 in TABLE 1) of the 5000 series described in JIS-H4000: 2014 containing 2.2 mass % or more and 2.8 mass % or less of Mg was used. As the Cu or Cu alloy of the joint (first joint 13, second joint 23) of the clad material 10, pure Cu (C1020 in TABLE 1) containing 99.6 mass % or more of Cu was used.

Specific Gravity

Each of Mg clad materials of No. 1 to No. 5 shown in TABLE 1 has a specific gravity of 2.0 or less, and thus it is suitable to ensure the lightness of the entire Mg clad material. Thus, the Mg clad materials of No. 1 to No. 5 are understood to be a Mg clad material capable of ensuring the lightness of the entire Mg clad material. Furthermore, it is understood that this Mg clad material is used such that it becomes possible to provide a Mg component such as an electronic device housing such as the housing 1 shown in FIG. 1 or a mobile object component in which its overall lightness is ensured.

TABLE 1

| No | TEST PIECE LAYER STRUCTURE | MATERIAL | THICKNESS (mm) | t3:t2:t4 | SOFT ANNEALING HOLDING CONDITIONS | SPECIFIC GRAVITY |
|---|---|---|---|---|---|---|
| 1 | FIVE-LAYERED CLAD | A1050/C1020/LZ91/C1020/A1050 | 0.6 | 1:4:1 | 350° C. 3 MINUTES | 1.93 |
| 2 | FIVE-LAYERED CLAD | A5052/C1020/LZ91/C1020/A5052 | 0.6 | 1:4:1 | 350° C. 3 MINUTES | 1.92 |
| 3 | FIVE-LAYERED CLAD | A5052/C1020/LAZ941/C1020/A5052 | 0.6 | 1:4:1 | 350° C., 3 MINUTES | 1.94 |
| 4 | FIVE-LAYERED CLAD | A5052/C1020/LAZ941/C1020/A5052 | 0.6 | 1:4:1 | 350° C., 5 MINUTES | 1.94 |

TABLE 1-continued

| No | | | | | |
|---|---|---|---|---|---|
| 5 | FIVE-LAYERED CLAD | A5052/C1020/LXZ921/C1020/A5052 | 0.6 | 1:4:1 | 350° C., 3 MINUTES | 1.94 |
| 6 | SINGLE LAYER | LZ91 | 0.6 | | 350° C., 3 MINUTES | 1.48 |
| 7 | SINGLE LAYER | LAZ941 | 0.6 | | 350° C., 3 MINUTES | 1.52 |
| 8 | SINGLE LAYER | A5052 | 0.6 | | 350° C., 3 MINUTES | 2.68 |
| 9 | SINGLE LAYER | AZ31 | 0.6 | | 350° C., 3 MINUTES | 1.77 |

| | TENSILE TEST | | THREE-POINT BENDING TEST | | |
|---|---|---|---|---|---|
| No | 0.2% PROOF STRESS (MPa) | ELONGATION (%) | 0.2% PROOF STRESS (MPa) | ELASTIC MODULUS (%) | 90 DEGREE BEND TEST (R ≤ 2 mm) |
| 1 | 158 | 16.8 | 285 | 56 | ○ |
| 2 | 194 | 9.6 | 337 | 59 | ○ |
| 3 | 261 | 5.6 | 377 | 66 | ○ |
| 4 | 237 | 9.2 | 353 | 61 | ○ |
| 5 | 202 | 7.6 | 351 | 62 | ○ |
| 6 | 121 | 43.0 | 191 | 39 | ○ |
| 7 | 216 | 23.0 | 362 | 54 | ○ |
| 8 | 260 | 12.0 | 405 | 73 | ○ |
| 9 | 105 | 11.0 | — | — | — |

Mechanical Characteristics by Tensile Test

A commonly used tensile test was conducted to investigate the mechanical characteristics of metallic materials. The tensile test of the clad material 10 (Mg clad material), the Mg plate material, and the Al plate material was conducted in accordance with JIS-Z2241: 2011 (Metallic materials-Tensile testing-Method). This tensile test was conducted under a room temperature atmosphere. TABLE 1 shows 0.2% proof stresses and elongations obtained by this tensile test.

Each of the Mg clad materials of No. 1 to No. 5 shown in TABLE 1 has a 0.2% proof stress of 150 MPa or more. The 0.2% proof stress of each of the Mg clad materials of No. 1 to No. 5 is 150 MPa or more specified in the present invention. The Mg clad materials of No. 2 to No. 5 have a 0.2% proof stress in a range of 190 MPa or more and 270 MPa or less, and is 180 MPa or more, which is preferable in the present invention. The Mg clad materials of No. 3 to No. 5 have a 0.2% proof stress in a range of 200 MPa or more and 270 MPa or less, and is 200 MPa or more, which is more preferably in the present invention. In particular, the Mg clad materials of No. 4 and No. 5 have a sufficiently high 0.2% proof stress in a range of 230 MPa or more and 270 MPa or less. From these results, it has been confirmed that the Mg clad materials of No. 1 to No. 5 having the structure of the present invention have an improved 0.2% proof stress measured in the tensile test under a room temperature atmosphere. Furthermore, it has been confirmed that the 0.2% proof stress of the Mg clad material can be further improved by appropriately selecting the Mg—Li alloy of the Mg layer. This result suggests that the 0.2% proof stress of the Mg clad material can be improved by appropriately selecting the Al or Al alloy of the Al layer.

For example, the 0.2% proof stress of the Mg clad material of No. 1 using the Mg—Li—Zn alloy (LZ91) for the Mg layer and using A1050 for the Al layer was less than 180 MPa whereas the 0.2% proof stress of the Mg clad material of No. 2 using the Mg—Li—Zn alloy (LZ91) for the Mg layer and using A5052 for the Al layer was 180 MPa or more. The 0.2% proof stress of the Mg clad material of No. 2 using the Mg—Li—Zn alloy (LZ91) for the Mg layer and using A5052 for the Al layer was less than 200 MPa whereas the 0.2% proof stresses of the Mg clad materials of No. 3 to No. 5 using the Mg—Li—Al—Zn alloy (LAZ921) or the Mg—Li—Ca—Zn alloy (LXZ921) for the Mg layer and using A5052 for the Al layer was 200 MPa or more. From these results, it can be seen that the Mg—Li—Al—Zn alloy (LAZ) or the Mg—Li—Ca—Zn alloy (LXZ) is preferably used for the base layer (Mg layer) of the Mg clad material for applications that require a sufficient proof stress. Furthermore, when the Mg clad materials of No. 1 and No. 2 are compared with the Mg clad materials of No. 3 and No. 4, it can be seen that the 0.2% proof stress is improved by the inclusion of Al in the Mg—Li—Zn alloy (LZ) and is 200 MPa or more. From this point of view, it is believed that a Mg clad material having a high proof stress can be obtained even when a Mg—Li—Al—Zn—Ca alloy (LAZ-X) containing Ca with respect to an alloy further containing Al with respect to a Mg—Li—Ca—Zn alloy (LXZ) having a 0.2% proof stress of 200 MPa or more, i.e., a Mg—Li—Al—Zn alloy (LAZ), is used for the base layer (Mg layer).

The Mg clad materials of No. 1 to No. 5 have an elongation of 5% or more. The Mg clad materials of No. 1, No. 2, and No. 4 have an elongation of 9% or more. In particular, the Mg clad material of No. 1 has an elongation of 16% or more. The elongations of the Mg clad materials of No. 3 and No. 4 having the same clad layer structure and different holding times for soft annealing are different from each other. These results suggest that the elongation of the Mg clad material can be improved depending on one of a means for appropriately selecting the Mg—Li alloy of the Mg layer, a means for appropriately selecting the Al or Al alloy of the Al layer, and a means for appropriately selecting the holding conditions for soft annealing or the combination of more than one of these. From these results, it is understood that the Mg clad materials of No. 1 to No. 5 having the structure of the present invention each have appropriate mechanical strength and preferable elongation while ensuring the lightness of the entire Mg clad material. Furthermore, it is understood that the Mg clad materials of No. 2 to No. 5 (especially, the Mg clad materials of No. 3 and No. 4) having the structure of the present invention each have mechanical strength to prevent easy deformation and have preferable elongation while ensuring the lightness of the entire Mg clad material. Moreover, it is understood that this Mg clad material is used such that it becomes possible to provide a Mg component such as an electronic device housing or a mobile object component with improved mechanical strength while ensuring its overall lightness.

Mechanical Characteristics by Three-Point Bending Test

A Mg component such as electronic device housing such as the housing 1 shown in FIG. 1 or a mobile object component is required to have mechanical strength (0.2% proof stress, elastic modulus) suitable for the intended use and to have mechanical strength (such as a 0.2% proof stress and an elastic modulus) to prevent easy deformation. In addition, manufacturing of a Mg component such as an electronic device housing such as the housing 1 or a mobile object component often involves bending, and thus good bending formability is required. Therefore, the mechanical characteristics by the three-point bending test were evaluated. The three-point bending test of the clad material 10 (Mg clad material), the Mg plate material, and the Al plate material was conducted in accordance with JIS-K7171: 2016 (Plastics—Determination of flexural properties) in consideration of the fact that the total thickness was 0.6 mm in spite of a metallic material. Test pieces used for this three-point bending test were cut out from the clad material 10, the Mg plate material, and the Al plate material equivalent to those in the tensile test described above. This three-point bending test was conducted under a room temperature atmosphere. TABLE 1 shows 0.2% proof stresses and elastic moduli obtained by this three-point bending test.

As described above, the Mg clad materials of No. 1 to No. 5 shown in TABLE 1 each have a specific gravity of 2.0 or less, and thus it is suitable to ensure the lightness of the entire Mg clad material. Furthermore, the Mg clad materials of No. 1 to No. 5 shown in TABLE 1 have a 0.2% proof stress in a range of 250 MPa or more and 390 MPa or less, and have a 0.2% proof stress of 250 MPa or more, which is considered preferable in the present invention. Even the Mg clad material of No. 1 having the lowest 0.2% proof stress in the three-point bending test has a 0.2% proof stress of 280 MPa or more, which is considered more preferable in the present invention. In particular, the Mg clad materials of No. 3 to No. 5 have a sufficiently high 0.2% proof stress in a range of 350 MPa or more and 390 MPa or less. Furthermore, the Mg clad materials of No. 1 to No. 5 each have an elastic modulus in a range of 50% or more and 70% or less in the three-point bending test, and have an elastic modulus of 50% or more, which is considered preferable in the present invention. In particular, the Mg clad materials of No. 3 to No. 5 including the base layer (Mg layer) made of LAZ941 or LXZ921 have an elastic modulus in a range of 60% or more and 70% or less, and have an elastic modulus of 60% or more, which is considered more preferable in the present invention. Thus, it has been confirmed that the Mg clad materials of No. 1 to No. 5 having the structure of the present invention have an improved 0.2% proof stress and elastic modulus measured in the three-point bending test under a room temperature atmosphere. From these results, it is understood that the Mg clad materials of No. 1 to No. 5 having the structure of the present invention each have appropriate mechanical strength and preferable moldability while ensuring the lightness of the entire Mg clad material. Furthermore, it is understood that the Mg clad materials of No. 2 to No. 5 having the structure of the present invention each have mechanical strength to prevent easy deformation and have preferable moldability while ensuring the lightness of the entire Mg clad material. Moreover, it is understood that this Mg clad material is used such that it becomes possible to provide a Mg component such as an electronic device housing or a mobile object component with improved mechanical strength while ensuring its overall lightness.

Mechanical Characteristics by 90 Degree Bend Test

With the same motive as the three-point bending test described above, a 90 degree bend test was conducted on the clad material 10 (Mg clad material), the Mg plate material, and the Al plate material in order to examine the formability of bending. This 90 degree bend test was conducted in accordance with JIS-Z2248: 2006 (Metallic materials-Bend test). Test pieces used for this 90 degree bend test were cut out from the clad material 10, the Mg plate material, and the Al plate material equivalent to those in the tensile test described above. This 90 degree bend test was conducted under a room temperature atmosphere with a bending R set to 2 mm (2 mm or less). In this 90 degree bend test, the presence or absence of defects such as cracks, breaks, and peeling was examined. The results of this 90 degree bend test are shown in TABLE 1 using ○ marks (no defects) or x marks (with defects).

In the Mg clad materials of No. 1 to No. 5 shown in TABLE 1, defects such as cracks, breaks, and peeling did not occur. Also in the Mg plate materials of No. 6 and No. 7 and the Al plate material of No. 8, defects such as cracks, breaks, and peeling did not occur. Consequently, it is understood that the moldability of the Mg clad materials of No. 1 to No. 5 is good similarly to the Mg plate material of No. 6, the Mg plate material of No. 7, and the Al plate material of No. 8 in the general bending process (press process) performed in manufacturing of the electronic device housing such as the housing 1.

From the results of the aforementioned evaluation, it has been confirmed that regarding the Mg clad material having the structure of the present invention, the lightness of the entire Mg clad material is ensured, the mechanical strength of the entire Mg clad material is improved, and the 0.2% proof stress measured in the tensile test under a room temperature atmosphere and the 0.2% proof stress measured in the three-point bending test under a room temperature atmosphere are improved. Thus, it is expected that regarding the electronic device housing (housing 1) or the mobile object component, which is an example of the Mg component using the Mg clad material having the structure of the present invention, the overall lightness of the Mg component such as the housing 1 is ensured, the overall mechanical strength of the Mg component such as the housing 1 is improved, and the 0.2% proof stress measured in the tensile test under a room temperature atmosphere and the 0.2% proof stress measured in the three-point bending test under a room temperature atmosphere are improved.

From the results of the aforementioned evaluation that the 0.2% proof stresses of the Mg clad materials of No. 3 and No. 4 using a Mg—Li—Al—Zn alloy (LAZ941) and the Mg clad material of No. 5 using a Mg—Li—Ca—Zn alloy (LXZ921), measured in the tensile test under a room temperature atmosphere are 200 MPa or more, the inventors have found that it is preferable to use a Mg—Li—Al—Zn alloy (LAZ) or a Mg—Li—Ca—Zn alloy (LXZ) as the Mg—Li alloy in order to produce a higher-strength Mg clad material. Furthermore, it is believed that a Mg—Li—Al—Zn—Ca alloy (LAZ-X) in which Ca is added to a Mg—Li—Al—Zn alloy (LAZ) is used such that the same effect can be obtained.

Although in the Mg clad materials of No. 2 to No. 4 in TABLE 1, an alloy of the A5000 series is used as the aluminum alloy, an alloy of the A6000 series is relatively smaller in hardness and higher in proof stress than other aluminum alloys (the A2000 series and A3000 series) similarly to the alloy of the A5000 series, and thus the same effect can be obtained even when the alloy of the A6000 series is used instead of the alloy of the A5000 series.

Although an aluminum alloy is used in the Mg clad materials of No. 2 to No. 4, it is also possible to use pure Al (such as A11050) having a high elongation rate in order to improve the elongation rate, for example.

Flammability Test of Mg Plate Material Made of Mg Alloy

Next, a flammability test was conducted on a Mg plate material made of a Mg alloy in order to find a Mg clad material having flame retardancy to prevent easy ignition while having the structure of the present invention but does not easily ignite. The test method is based on the magnesium-flammability test method of JIS H 0544. Specifically, a sample having a JIS-specified shape and prepared using a Mg plate material made of a Mg alloy was fixed to a fixing member, and a gas burner was arranged such that a surface (test surface) of the sample subjected to the flammability test was perpendicular to the flame. The gas burner used in the flammability test was adjusted such that the flame temperature was 1050° C.±50° C.

As shown in TABLE 2, a plate of a Mg—Al—Zn alloy (AZ31) was prepared as a sample A. A plate of a Mg—Li—Zn alloy (LZ91) was prepared as a sample B. A plate of a Mg—Li—Zn—Ca alloy (LZ91-X0.5) in which 0.5 mass % of Ca was added to a Mg—Li—Zn alloy (LZ91) was prepared as a sample C. Plates of a Mg—Li—Zn—Ca alloy (LZ91-X0.75) in which 0.75 mass % of Ca was added to a Mg—Li—Zn alloy (LZ91) were prepared as samples D and E. A plate of a Mg—Li—Ca—Zn alloy (LXZ911) in which 1.0 mass % of Ca was added to a Mg—Li—Zn alloy (LZ91) was prepared as a sample F. A plate of a Mg—Li—Ca—Zn alloy (LXZ921) in which 2.0 mass % of Ca was added to a Mg—Li—Zn alloy (LZ91) was prepared as a sample G. A plate of a Mg—Li—Al—Zn alloy (LAZ941) was prepared as a sample H. The samples E to G were solution-treated. Two samples (A1, A2 . . . H1, H2) were prepared for each of the samples A to C and E to H, and the flammability test was conducted. In addition, based on the JIS standards, the mass of each sample was measured before the start of the flammability test.

TABLE 2

FLAMMABILITY TEST MATERIAL (MASS %)

| SAMPLE REFERENCE LETTER | ALLOY TYPE | Li | Al | Ca | Zn | Mg | OTHER ELEMENTS | SOLUTION TREATMENT |
|---|---|---|---|---|---|---|---|---|
| A | AZ31 | <0.01 | 3.0 | <0.01 | 1.0 | BALANCE | <0.01 | WITHOUT |
| B | LZ91 | 9.0 | <0.01 | <0.01 | 1.0 | BALANCE | <0.01 | WITHOUT |
| C | LZ91-X0.5 | 9.0 | <0.01 | 0.5 | 1.0 | BALANCE | <0.01 | WITHOUT |
| D | LZ91-X0.75 | 9.0 | <0.01 | 0.75 | 1.0 | BALANCE | <0.01 | WITHOUT |
| E | LZ91-X0.75 | 9.0 | <0.01 | 0.75 | 1.0 | BALANCE | <0.01 | WITH |
| F | LXZ911 | 9.0 | <0.01 | 1.0 | 1.0 | BALANCE | <0.01 | WITH |
| G | LXZ921 | 9.0 | <0.01 | 2.0 | 1.0 | BALANCE | <0.01 | WITH |
| H | LAZ941 | 9.0 | 4.0 | <0.01 | 1.0 | BALANCE | <0.01 | WITHOUT |

In the flammability test, the test surfaces of the samples were continuously heated with a flame for one hundred seconds. For each sample, the presence or absence of ignition, the time from the start of heating to ignition (ignition time), the time from ignition to extinguishment (burning time), and the burning time after the completion of heating of the sample were measured. When there was a sample (melted off sample) that has melted off from the sample fixed to a support member, the presence or absence of burning of the melted off sample and the time until extinguishment of the melted off sample (burning time after melting off) were measured. In addition, after the flammability test, the masses of the sample fixed to the support member and the melted off sample were measured. The results of the flammability test are shown in TABLE 3.

TABLE 3

| SAMPLE | | | | | MELTED OFF SAMPLE | | MASS CHANGE RATE BEFORE AND AFTER FLAMMABILITY TEST (%) |
|---|---|---|---|---|---|---|---|
| SAMPLE REFERENCE NUMBER | IGNITION | IGNITION TIME (s) | BURNING TIME (s) | BURNING TIME AFTER COMPLETION OF HEATING (s) | BURNING | BURNING TIME (s) | |
| A1 | PRESENT | 63 | 45 | 8 | PRESENT | 182 | 0.3 |
| A2 | PRESENT | 64 | 39 | 3 | PRESENT | 305 | 0.2 |
| B1 | PRESENT | 63 | 62 | 25 | PRESENT | 48 | 2.7 |
| B2 | PRESENT | 64 | 83 | 47 | PRESENT | 162 | 4.0 |
| C1 | PRESENT | 62 | 83 | 45 | PRESENT | 63 | 4.5 |
| C2 | PRESENT | 58 | 74 | 32 | PRESENT | 154 | 3.5 |
| D1 | PRESENT | 65 | X | X | PRESENT | X | 7.1 |
| E1 | PRESENT | 61 | 62 | 23 | PRESENT | 181 | 4.0 |
| E2 | PRESENT | 57 | X | X | PRESENT | X | 14.2 |
| F1 | PRESENT | 68 | 79 | 47 | PRESENT | 81 | 5.5 |
| F2 | PRESENT | 59 | X | X | PRESENT | X | 6.9 |
| G1 | PRESENT | 58 | X | X | PRESENT | X | 15.1 |

TABLE 3-continued

| SAMPLE | | | | | MELTED OFF SAMPLE | | MASS CHANGE |
|---|---|---|---|---|---|---|---|
| SAMPLE REFERENCE NUMBER | IGNITION | IGNITION TIME (s) | BURNING TIME (s) | BURNING TIME AFTER COMPLETION OF HEATING (s) | BURNING | BURNING TIME (s) | RATE BEFORE AND AFTER FLAMMABILITY TEST (%) |
| G2 | PRESENT | 80 | X | X | PRESENT | X | 17.3 |
| H1 | ABSENT | — | — | — | — | — | 5.8 |
| H2 | ABSENT | — | — | — | — | — | 6.8 |

X INDICATES THAT FLAMMABILITY TEST HAS BEEN INTERRUPTED MIDWAY BECAUSE BURNING DID NOT STOP.

As shown in TABLE 3, the Mg—Al—Zn alloy (AZ31) of the sample A and the Mg—Li—Zn alloy (LZ91) of the sample B ignited, and even after one hundred seconds had passed and the gas burner was turned off, burning of the samples and the melted off samples continued. Furthermore, the samples C to G (LZ91-X0.5, LZ91-X0.75, LXZ911, LXZ921) containing Ca with respect to the Mg—Li—Zn alloy all ignited, and after one hundred seconds had passed and the gas burner was turned off, burning of the samples and the melted off samples continued. In particular, it has been found that the samples D to G (LZ91-X0.75, LXZ911, LXZ921) containing 0.75 mass % or more of Ca with respect to the Mg—Li—Zn alloy burn intensely. The burning continued for a long time, and thus the flammability test of some samples was interrupted without waiting for the fire to be extinguished. Thus, the time indicated by "x" in TABLE 3 could not be measured. On the other hand, the Mg—Li—Al—Zn alloy (LAZ941) of the sample H did not ignite, and thus the sample did not burn.

From the above results, it has been found that the Mg—Li—Al—Zn alloy (LAZ941) of the sample H does not ignite unlike the Mg—Al—Zn alloy (AZ31) of the sample A, the Mg—Li—Zn alloy (LZ91) of the sample B, and the alloys (LZ91-X0.5, LZ91-X0.75, LXZ911, LXZ921) containing Ca with respect to the Mg—Li—Zn alloys of the samples C to G, and thus it has flame retardancy or non-flammability. Furthermore, unlike the other samples, the sample H is considered to exhibit flame retardancy or non-flammability because it contains both Li and Al. Therefore, an alloy containing another element with respect to the Mg—Li—Al—Zn alloy (LAZ), e.g., the Mg—Li—Al—Zn—Ca alloy (LAZ-X) in which Ca is added, is also considered to exhibit flame retardancy or non-flammability.

Next, the Mg—Li—Al—Zn alloy (LAZ) found to be flame-retardant or non-flammable in the above flammability test was analyzed by EPMA-SXES, AES, and XRD. Specifically, a plurality of samples were taken from LAZ921 containing 9 mass % of Li, 2 mass % of Al, and 1 mass % of Zn with respect to Mg, LAZ931 containing 9 mass % of Li, 3 mass % of Al, and 1 mass % of Zn with respect to Mg, LAZ941 (see the sample H) containing 9 mass % of Li, 4 mass % of Al, and 1 mass % of Zn with respect to Mg, LZ91 (see the sample B) containing 9 mass % of Li and 1 mass % of Zn but not containing Al with respect to Mg, and AZ31 (sample A) containing 3 mass % of Al and 1 mass % of Zn but not containing Li with respect to Mg.

Then, the taken samples were placed in a crucible, heated to 500° C., and cooled to ordinary temperature under an atmosphere, and samples for analysis were collected from what remained in the crucible. While the samples were heated to 500° C. and cooled to ordinary temperature, LAX921, LAX931, and LAX941 (see the sample H) did not ignite or burn, and those remaining after cooling were hard to crumble. On the other hand, LZ91 (see the sample B) and AZ31 (sample A) ignited and burned, and those remaining after cooling were fragile and easy to crumble.

EPMA-SXES

Samples for analysis (LZ91, AZ31, LAZ921, and LAZ941) were analyzed by an electron probe microanalyzer (EPMA)-soft X-ray emission spectrometer (SXES) of JEOL Ltd.

Figure 7:
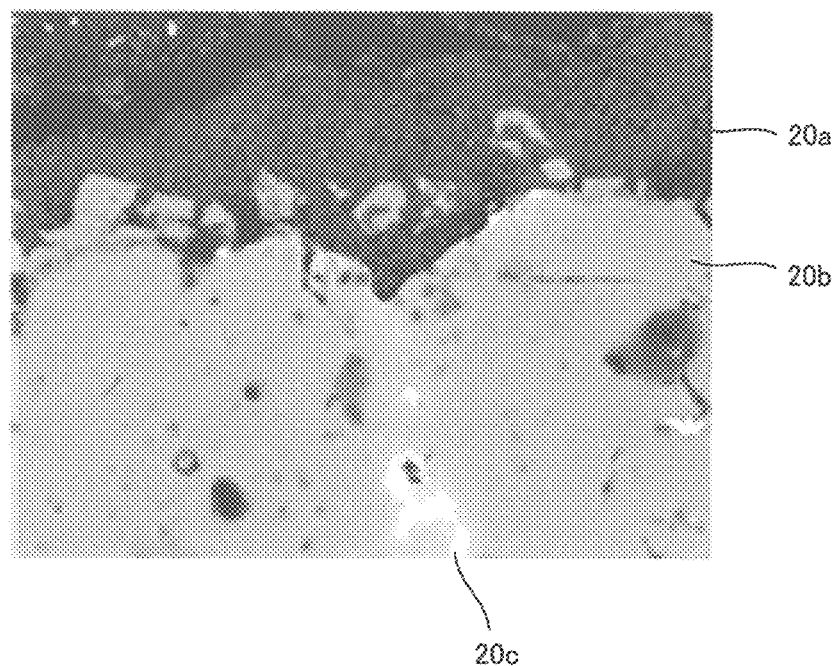
FIG. 7 An electron micrograph of an analytical sample (LZ91).

A first sample is a Mg—Li—Zn alloy (LZ91) containing Li but not Al. As shown in FIG. 7, in the first sample, a gray portion 20a on the surface side of the sample having no metallic luster and looking dark, a gray portion 20b on the inner side of the sample having metallic luster and looking bright, and a gray-white portion 20c looking brighter than the gray portion 20b were observed. In the gray portion 20a of the first sample, a structure rich in C, N, and O was confirmed. Furthermore, in a region of the gray portion 20b adjacent to the gray portion 20a and the gray-white portion 20c of the first sample, a structure rich in Zn and Al in addition to Mg was confirmed.

Figure 8:
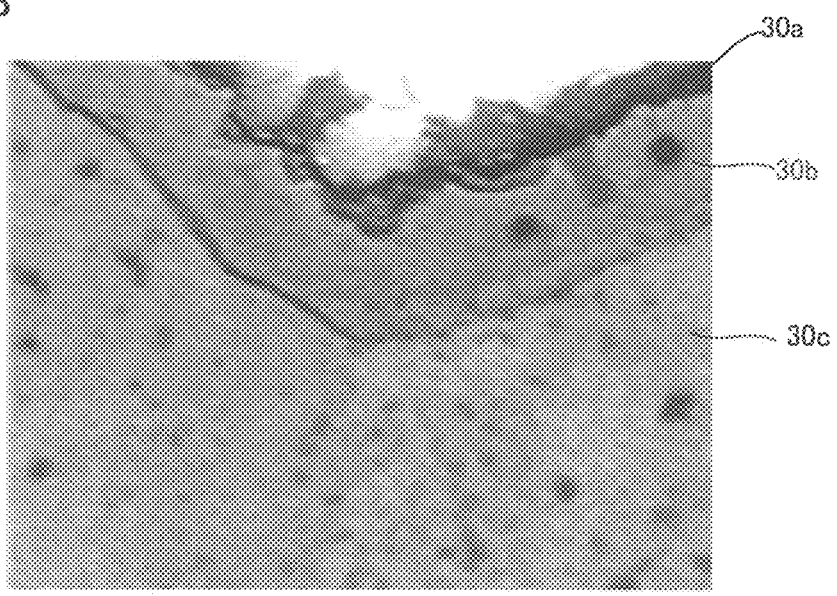
FIG. 8 An electron micrograph of an analytical sample (AZ31).

A second sample is a Mg—Al—Zn alloy (AZ31) containing Al but not Li. As shown in FIG. 8, in the second sample, a gray portion 30a on the surface side of the sample having no metallic luster and looking dark, a gray portion 30b on the inner side of the sample having metallic luster and looking bright, and a gray portion 30c looking brighter than the gray portion 30b were observed. In the gray portion 30a of the second sample, a structure rich in C, N, and O was confirmed. In the gray portion 30b of the second sample, a structure rich in N and Al was confirmed. In the gray portion 30c of the second sample, a structure rich in Mg and Zn was confirmed.

Figure 9:
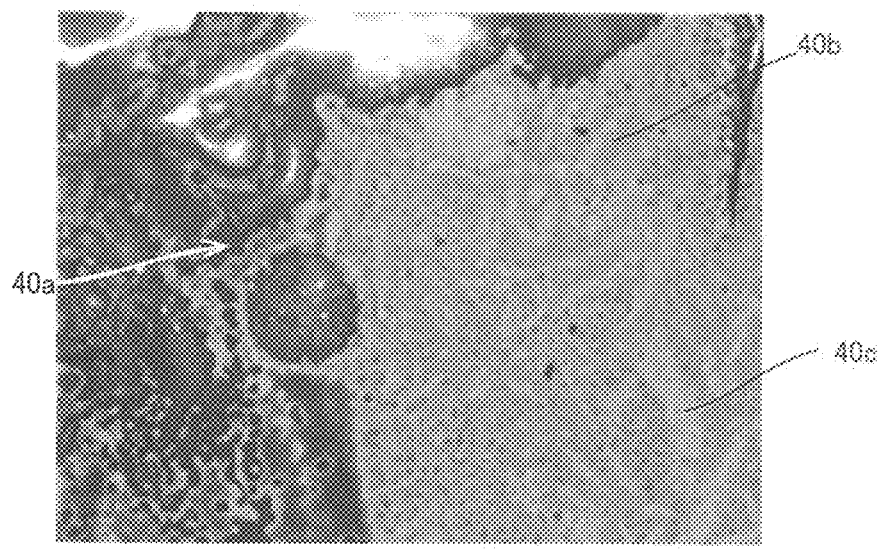
FIG. 9 An electron micrograph of an analytical sample (LAZ921).

A third sample is a Mg—Li—Al—Zn alloy (LAZ921) containing Li and 2 mass % of Al. As shown in FIG. 9, in the third sample, a gray portion 40a on the surface side of the sample having no metallic luster and looking like black, a gray portion 40b on the inner side of the sample having metallic luster and looking bright, and a gray portion 40c looking brighter than the gray portion 40b were observed. In the gray portion 40a of the third sample, a structure rich in C, N, and O was confirmed. In the gray portion 40b of the third sample, a structure containing large amounts of Al and Zn and containing C and O in addition to Mg was confirmed. In the gray portion 40c of the third sample, a structure containing a larger amount of Mg than that of the gray portion 40b, containing large amounts of Al and Zn, and containing Li was confirmed.

Figure 10:
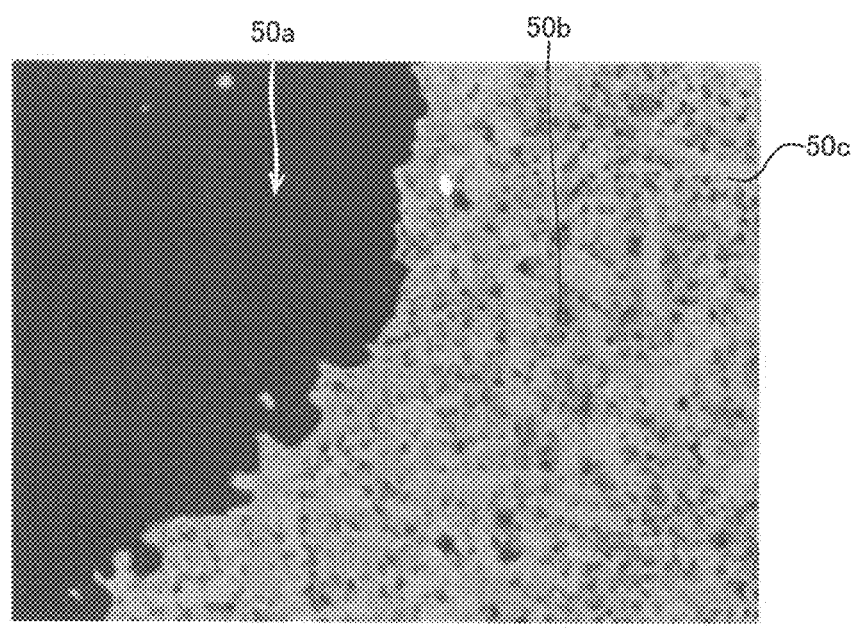
FIG. 10 An electron micrograph of an analytical sample (LAZ941).

A fourth sample is a Mg—Li—Al—Zn alloy (LAZ941) containing Li and 4 mass % of Al. As shown in FIG. 10, in the fourth sample, a gray portion 50a on the surface side of the sample having no metallic luster and looking like black, a gray portion 50b on the inner side of the sample having metallic luster and appearing slightly dark gray to slightly light gray, and a gray portion 50c looking brighter than the gray portion 50b were observed. In the gray portion 50a of the fourth sample, a structure rich in C, N, and O was confirmed. In the gray portion 50b of the fourth sample, a structure containing large amounts of Al and Zn and containing C and O in addition to Mg was confirmed. In the gray portion 50c of the fourth sample, a structure containing a larger amount of Mg than that of the gray portion 50b, containing a large amount of Al and Zn, and containing Li was confirmed.

Large amounts of C, N, and O were confirmed from the gray portions (the gray portion 20a, the gray portion 30a, the gray portion 40a, and the gray portion 50a) on the outer sides of the samples having no metallic luster in the first to fourth samples. From these results, it is believed that the gray portions (the gray portion 20a, the gray portion 30a, the gray portion 40a, and the gray portion 50a) on the outer side of the samples having no metallic luster have been deteriorated by ignition/burning and have been deteriorated over time from ignition/burning to analysis through cooling.

A large amount of Al was confirmed from the gray portions (the gray portion 20b, the gray-white portion 20c, the gray portion 30b, the gray portion 40b, the gray portion 40c, the gray portion 50b, and the gray portion 50c) on the inner sides of the samples having metallic luster in the first sample to fourth sample. Furthermore, Li was confirmed together with a large amount of Al from the gray portion 40c of the third sample (LAZ921) and the gray portion 50c of the fourth sample (LAZ941). From these results and the Mg—Li—Al—Zn alloys (LAZ921, LAZ941) that did not ignite or burn, it is believed that ignition/burning has been prevented by the structure in which a large amount of Al was confirmed or the structure in which Li was confirmed together with a large amount of Al.

In the analysis by EPMA-SXES, Al and Li were confirmed in the third sample (LAZ921) and the fourth sample (LAZ941) in which ignition/burning did not occur. It is believed that in the Mg—Li—Al—Zn alloy (LAZ) containing Al and Li, ignition/burning has been prevented by generation of a compound containing Al (such as an Al oxide) or generation of a compound containing Al and Li (such as an Al—Li oxide). Furthermore, from the viewpoint that the Mg—Li—Ca—Zn alloy (LXZ) containing Li and Ca but not Al ignited and burned during the above flammability test, it is believed that the presence of an appropriate amount of Li and Al with respect to Mg has brought about the effect of suppressing ignition/burning (flame retardancy or non-flammability).

AES

Samples for analysis (LZ91 and LAZ941) were analyzed by JAMP-9510F of JEOL Ltd. to which Auger electron spectroscopy (AES) was applied.

A first sample is a Mg—Li—Zn alloy (LZ91) containing Li but not Al. A black portion and a white portion were confirmed on a surface of the first sample (see FIG. 7). From the average spectrum by AES (10 kV, 10 nA, $\Delta E/E$=0.5%, tilt angle: 30 degrees, beam diameter: 50 μm, after etching (3 kV, 60 s→28.8 nm as $SiO_2$)), it has been confirmed that in the black portion on the surface of the first sample, Mg is 47.4 at % and O is 52.6 at %. Similarly, it has been confirmed that in the white portion on the surface of the first sample, Mg is 49.3 at % and O is 50.9 at %. From these results, it is inferred that the surface of the first sample is covered with a Mg oxide (such as MgO).

A second sample is a Mg—Li—Al—Zn alloy (LAZ941) containing Li and 4 mass % of Al. A white portion was confirmed on a surface of the second sample (see FIG. 10). From the average spectrum by AES (10 kV, 10 nA, $\Delta E/E$=0.5%, tilt angle: 30 degrees), it has been confirmed that in the white portion on the surface of the second sample, Mg is 35.1 at %, Li is 7.6 at %, Al is 4.9 at %, and O is 52.4 at %. Furthermore, from the average spectrum of the surface (cleavage surface) in which the second sample is broken, it has been confirmed that Mg is 30.4 at %, Li is 15.3 at %, Al is 7.5 at %, and O is 45.8 at %. From these results, it is inferred that the surface and the inside of the second sample are covered with a Mg oxide (such as MgO), a Li oxide (such as $Li_2O$), an Al oxide (such as $Al_2O_3$), or a composite oxide of these (such as $LiAlO_2$ or $MgAl_2O_4$), for example.

XRD

Samples for analysis (AZ31, LZ91, LAZ921, LAZ931, and LAZ941) were analyzed by an X-ray diffraction (XRD) apparatus RINT2200 of Rigaku Corporation. The XRD analysis was performed by a tube Cu-Kα: 1.54056 Å, a tube voltage: 40 kV, a tube current: 40 mA, a measurement angle (2θ/θ): 20° to 90°, and a speed: 1.2 s/step.

A first sample is a Mg—Al—Zn alloy (AZ91) containing Al but not Li. A second sample is a Mg—Li—Zn alloy (LZ91) containing Li but not Al. A third sample is a Mg—Li—Al—Zn alloy (LAZ921) containing Li and 2 mass % of Al. A fourth sample is a Mg—Li—Al—Zn alloy (LAZ931) containing Li and 3 mass % of Al. A fifth sample is a Mg—Li—Al—Zn alloy (LAZ941) containing Li and 4 mass % of Al.

Figure 11:
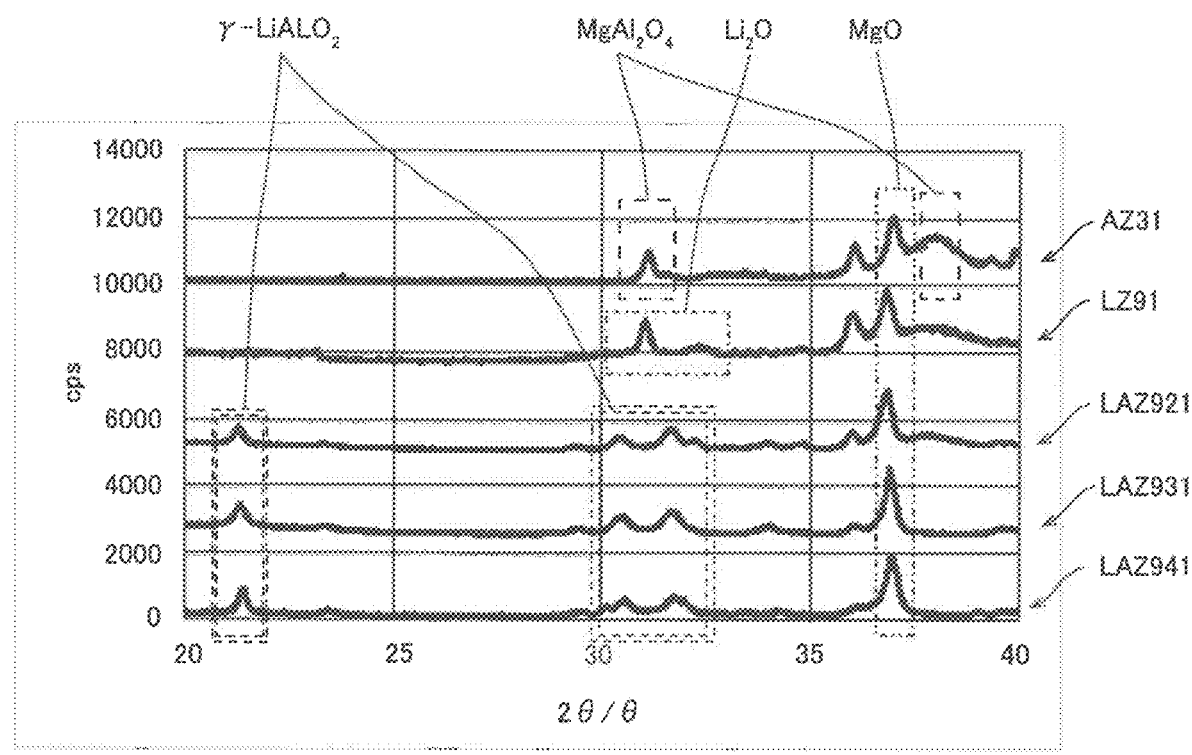
FIG. 11 A waveform diagram of analytical samples (AZ31, LZ91, LAZ921, LAZ931, and LAZ941) by XRD analysis.

FIG. 11 is waveform diagrams showing the relationship between the measurement angle (2θ/θ) and the intensity (cps) in the first to fifth samples. It has been confirmed that the waveform diagrams of the first to fifth samples each has a characteristic peak. As shown in FIG. 11, in the first sample (AZ31), a peak indicating the presence of $MgAl_2O_4$ was confirmed in portions surrounded by broken lines, and a peak indicating the presence of MgO was confirmed in a portion surrounded by a two-dot chain line. In the second sample (LZ91), a peak indicating the presence of $Li_2O$ was confirmed in a portion surrounded by a one-dot chain line, and a peak indicating the presence of MgO was confirmed in a portion surrounded by a two-dot chain line. In the third sample (LAZ921) to the fifth sample (LAZ941), a peak indicating the presence of γ-$LiAlO_2$ was confirmed in portions surrounded by double broken lines, and a peak indicating the presence of MgO was confirmed in a portion surrounded by a two-dot chain line. That is, it has been confirmed that γ-$LiAlO_2$, which is a composite oxide of Li and Al that does not exist in the first sample (AZ31) and the second sample (LZ91) in which ignition/burning has occurred, exists in the third sample (LAZ921) to the fifth sample (LAZ941) in which ignition/burning has not occurred.

From the above results, it can be understood that in the Mg—Li—Al—Zn alloy containing appropriate amounts of Li and Al (such as LAZ921, LAZ931, or LAZ941), γ-$LiAlO_2$, which is a composite oxide of Li and Al, is generated, and thus the effect of preventing ignition/burning is produced.

From the above various experimental results, the inventors have found that the Mg clad material using the Mg—Li—Al—Zn alloy (such as LAZ921, LAZ931, or LAZ941) among the Mg—Li alloys has a lower specific gravity than an aluminum alloy material made of an aluminum alloy such as A5052, has a higher 0.2% proof stress measured in the tensile test under a room temperature atmosphere and a higher 0.2% proof stress measured in the three-point bending test under a room temperature atmosphere than a magnesium alloy material made of an Al-free magnesium alloy such as AZ31 and LZ91, has a moderate elongation, and has flame retardancy or non-flammability. Therefore, the Mg clad material in which the flame-retardant or non-flammable Mg—Li—Al—Zn alloy (such as LAZ921, LAZ931, or LAZ941) is used as the base layer (Mg layer), the high-strength Al alloy (such as A5052), for example, is used as the Al layer, and the base layer (Mg layer) and the Al layer are bonded by the first joint made of pure Cu or a Cu alloy has improved overall mechanical strength while ensuring its overall lightness and has flame retardancy to prevent easy ignition. Thus, the electronic device housing or the mobile object component, which is an example of a Mg component using this Mg clad material, has improved overall mechanical strength while ensuring its overall lightness and has flame retardancy to prevent easy ignition.

As described above, the Mg clad material having the structure of the present invention can be used as a structural material to reduce the weight of the Mg component, and can be applied to the housing 1 (electronic device housing) shown in FIG. 1 or a mobile object component, for example. Examples of such a Mg component include electronic device components such as housings of personal computers, mobile housings, and in-vehicle housings. Furthermore, examples of a Mg component for which lightness and high strength are desired, and flame retardancy or non-flammability is desired include mobile object components such as exterior panels (metal panels) of automobile doors, roofs, hoods, etc., exterior panels for railroad vehicles (Shinkansen, linear motor cars, etc.), aircraft (airplane, helicopter, etc.) skins, and skins and skeleton components of unmanned aerial vehicles, etc.

MODIFIED EXAMPLES

The embodiments and Examples disclosed in this specification must be considered as illustrative in all points and not restrictive. The scope of the present invention is not shown by the above description of the embodiments and Examples but by the scope of claims for patent, and all modifications (modified examples) within the meaning and range equivalent to the scope of claims for patent are further included.

While regarding the Mg clad material according to the present invention, an example of the Mg clad material having a three-layer structure is shown in FIG. 2 and examples of the Mg clad material having a five-layer structure are shown in FIGS. 3 and 4, for example, the present invention is not restricted to this. The Mg clad material according to the present invention may have a clad layer structure in which another metal layer (such as a Ni layer made of pure Ni or a Ni alloy) is bonded to a surface of the first Al layer opposite to the Mg layer, or a clad layer structure in which another metal layer (such as a Ni layer made of pure Ni or a Ni alloy) is bonded to a surface of the second Al layer opposite to the Mg layer.

While regarding the Mg clad material according to the present invention, an example of the clad material 10 is shown in FIG. 4 in which the joint 13 (first joint) is arranged such that the island-shaped portions are distributed over the entire area between the Mg layer 11 and the Al layer 12, for example, the present invention is not restricted to this. In the present invention, the first joint having the island-shaped portions partially arranged between the Mg layer and the first Al layer may be formed in the Mg clad material. For example, the Mg clad material according to the present invention is not limited to an overlay Mg clad material, but may be an inlay Mg clad material in which a first joint is arranged only in a portion between a Mg layer and a first Al layer. At this time, it is believed that the first joint is formed only on the peripheral portion of the Mg layer excluding the central portion such that peeling between the Mg layer and the first Al layer can be effectively suppressed. These points are the same for the second joint arranged between the Mg layer and the second Al layer.

Regarding the Mg clad material according to the present invention, it is preferable to sufficiently soften the Mg clad material by heat treatment after rolling, and this can be used to improve the press workability when a Mg component is manufactured. From this point of view, for the Mg clad material including the Mg layer 11 made of LAZ941, for example, heat treatment may be performed at a low temperature (150° C. or higher and 250° C. or lower, for example) for a long time (one hour or more and five hours or less, for example) using a batch type heating furnace.

While regarding the electronic device housing according to the present invention, an example is shown in FIG. 1 in which the clad material 5 or the clad material 10 is used as the housing 1 of the electronic device 100, for example, the present invention is not restricted to this. The Mg clad material according to the present invention may be used as a mobile object component other than the housing of the electronic device, e.g., a component (Mg component) of a mobile object such as an automobile, a motorcycle, a railroad vehicle, or an aircraft. In this case, it is preferable to use the Mg clad material according to the present invention for applications requiring lightness, applications requiring high strength, or applications requiring flame retardancy by properly configuring the Mg clad material.

DESCRIPTION OF REFERENCE NUMERALS 1. housing (electronic device housing)
10. clad material (magnesium clad material)
11. Mg layer
12. Al layer (first Al layer)
13. joint (first joint)
13a. island-shaped portion
22. Al layer (second Al layer)
23. joint (second joint)
23a. island-shaped portion
100. electronic device
101. roller
111. Mg plate material
112. Al plate material
113. Cu plate material
122. Al plate material
123. Cu plate material

The invention claimed is:
1. A magnesium clad material comprising when a cross-section thereof cut in a thickness direction thereof is observed:
a Mg layer made of a Mg—Li alloy and serving as a base layer;
a first Al layer made of pure Al or an Al alloy; and
a first joint made of pure Cu or a Cu alloy and arranged between the Mg layer and the first Al layer; wherein
the magnesium clad material has a 0.2% proof stress of 150 MPa or more as measured in a tensile test under a room temperature atmosphere; and
the Mg—Li alloy comprises LAZ921, LAZ931, or LAZ941, which contains Al and Zn, and has flame retardancy in that the Mg—Li alloy does not ignite in a flammability test at 1050° C.

2. The magnesium clad material according to claim 1, wherein the 0.2% proof stress is 180 MPa or more.

3. The magnesium clad material according to claim 1, wherein the 0.2% proof stress is 230 MPa or more and 270 MPa or less.

4. The magnesium clad material according to claim 1, comprising when the cross-section thereof cut in the thickness direction thereof is observed:
   a second Al layer made of Al or an Al alloy and arranged on a side of the Mg layer opposite to the first Al layer; and
   a second joint made of Cu or a Cu alloy and arranged between the Mg layer and the second Al layer.

5. The magnesium clad material according to claim 1, wherein the Al alloy has a composition corresponding to any one of 5000 series to 7000 series of alloy numbers described in JIS-H4000: 2014.

6. The magnesium clad material according to claim 5, wherein the Al alloy has a composition corresponding to any one of the 5000 series to 6000 series of alloy numbers described in JIS-H4000: 2014.

7. The magnesium clad material according to claim 6, wherein
   the Al alloy has a composition corresponding to the 5000 series of alloy numbers described in JIS-H4000: 2014; and
   the 0.2% proof stress is 190 MPa or more and 270 MPa or less.

8. The magnesium clad material according to claim 1, wherein the Mg—Li alloy contains 2 mass % or more and 4 mass % or less of Al.

9. The magnesium clad material according to claim 1, wherein the magnesium clad material has a 0.2% proof stress of 200 MPa or more measured in the tensile test under a room temperature atmosphere.

10. An electronic device housing made of a magnesium clad material, the magnesium clad material comprising when a cross-section thereof cut in a thickness direction thereof is observed:
    a Mg layer made of a Mg—Li alloy and serving as a base layer;
    a first Al layer made of pure Al or an Al alloy; and
    a first joint made of pure Cu or a Cu alloy and arranged between the Mg layer and the first Al layer; wherein
    the magnesium clad material has a 0.2% proof stress of 150 MPa or more as measured in a tensile test under a room temperature atmosphere; and
    the Mg—Li alloy comprises LAZ921, LAZ931, or LAZ941, which contains Al and Zn, and has flame retardancy in that the Mg—Li alloy does not ignite in a flammability test at 1050° C.

11. A transport mobile object component made of a magnesium clad material, the magnesium clad material comprising when a cross-section thereof cut in a thickness direction thereof is observed:
    a Mg layer made of a Mg—Li alloy and serving as a base layer;
    a first Al layer made of pure Al or an Al alloy; and
    a first joint made of pure Cu or a Cu alloy and arranged between the Mg layer and the first Al layer; wherein
    the magnesium clad material has a 0.2% proof stress of 150 MPa or more as measured in a tensile test under a room temperature atmosphere; and
    the Mg—Li alloy comprises LAZ921, LAZ931, or LAZ941, which contains Al and Zn, and has flame retardancy in that the Mg—Li alloy does not ignite in a flammability test at 1050° C.

12. A magnesium clad material comprising when a cross-section thereof cut in a thickness direction thereof is observed:
    a Mg layer made of a Mg—Li alloy and serving as a base layer;
    a first Al layer made of pure Al or an Al alloy; and
    a first joint made of pure Cu or a Cu alloy and arranged between the Mg layer and the first Al layer; wherein
    the magnesium clad material has a 0.2% proof stress of 150 MPa or more as measured in a tensile test under a room temperature atmosphere; and
    the Mg—Li alloy comprises LXZ911 or LXZ921 which contains Ca and Zn.

* * * * *